(12) United States Patent
Kawamura

(10) Patent No.: US 12,071,508 B2
(45) Date of Patent: Aug. 27, 2024

(54) POLYMERS, USE THEREOF AS HOLE TRANSPORT MATERIAL, AND ORGANIC ELECTRONIC DEVICES COMPRISING SAME

(71) Applicant: LG Chem, Ltd., Seoul (KR)

(72) Inventor: Hisayuki Kawamura, Tokyo (JP)

(73) Assignee: LG Chem, Ltd., Seoul (KR)

( * ) Notice: Subject to any disclaimer, the term of this patent is extended or adjusted under 35 U.S.C. 154(b) by 825 days.

(21) Appl. No.: 17/255,239

(22) PCT Filed: Aug. 14, 2019

(86) PCT No.: PCT/KR2019/010358
§ 371 (c)(1),
(2) Date: Dec. 22, 2020

(87) PCT Pub. No.: WO2020/036434
PCT Pub. Date: Feb. 20, 2020

(65) Prior Publication Data
US 2021/0115186 A1    Apr. 22, 2021

(30) Foreign Application Priority Data
Aug. 16, 2018    (JP) .................................. 2018-153123

(51) Int. Cl.
*C08G 61/02* (2006.01)
*H05B 33/10* (2006.01)
(Continued)

(52) U.S. Cl.
CPC ............. *C08G 61/02* (2013.01); *H05B 33/10* (2013.01); *H10K 85/10* (2023.02); *H10K 85/633* (2023.02); *H10K 50/15* (2023.02); *H10K 50/18* (2023.02)

(58) Field of Classification Search
CPC ..... C08G 61/02; C08G 61/12; C08G 73/0273
See application file for complete search history.

(56) References Cited

U.S. PATENT DOCUMENTS 7,310,273 B2 * 12/2007 Im ........................ G11C 11/4094
365/203
7,910,687 B2 * 3/2011 Busing .................. C08G 61/126
528/7
(Continued)

FOREIGN PATENT DOCUMENTS

CN    101878241 A    11/2010
CN    104321362 A    1/2015
(Continued)

OTHER PUBLICATIONS

English translation of written opinion ETWOS (no date).*
(Continued)

*Primary Examiner* — Amanda C. Walke
(74) *Attorney, Agent, or Firm* — Lerner David LLP

(57) ABSTRACT

Provided is a novel polymer capable of being used as a hole transfer material for an organic electronic device, particularly, an organic EL device.

The polymer of the present disclosure includes a repeating unit represented by Formula (1) as follows in 40 mol % to 100 mol % of the whole repeating unit forming the polymer, (Continued)

wherein at least one of R4 and R5 is an aromatic amino group.

18 Claims, 1 Drawing Sheet

(51) Int. Cl.
*H10K 85/10* (2023.01)
*H10K 85/60* (2023.01)
*H10K 50/15* (2023.01)
*H10K 50/18* (2023.01)

(56) References Cited

U.S. PATENT DOCUMENTS

| | | | |
|---|---|---|---|
| 8,487,055 | B2 | 7/2013 | Radu et al. |
| 9,929,347 | B2* | 3/2018 | Sekine ............... H10K 85/151 |
| 2003/0180596 | A1 | 9/2003 | Yoshimura et al. |
| 2004/0135131 | A1 | 7/2004 | Treacher et al. |
| 2004/0260090 | A1 | 12/2004 | Treacher et al. |
| 2006/0058494 | A1 | 3/2006 | Busing et al. |
| 2009/0096355 | A1 | 4/2009 | Ohuchi et al. |
| 2010/0230666 | A1* | 9/2010 | Ohuchi .................. C07C 17/12 585/446 |
| 2011/0303876 | A1 | 12/2011 | Ludemann et al. |
| 2014/0231771 | A1 | 8/2014 | Yomogita et al. |
| 2015/0069303 | A1 | 3/2015 | Eckes et al. |
| 2015/0076415 | A1* | 3/2015 | Heil ..................... H10K 85/115 528/7 |
| 2015/0108408 | A1 | 4/2015 | Eckes et al. |
| 2015/0115204 | A1 | 4/2015 | Sekine et al. |
| 2016/0301005 | A1 | 10/2016 | Pfister et al. |
| 2017/0283546 | A1 | 10/2017 | Sakakibara et al. |
| 2017/0324038 | A1 | 11/2017 | Jatsch et al. |

FOREIGN PATENT DOCUMENTS

| | | |
|---|---|---|
| EP | 1892257 A1 | 2/2008 |
| JP | 2012519214 A | 8/2012 |
| JP | 2015514839 A | 5/2015 |
| JP | 2015516487 A | 6/2015 |
| JP | 2015519424 A | 7/2015 |
| KR | 20030092020 A | 12/2003 |
| KR | 20080031733 A | 4/2008 |
| KR | 20100087341 A | 8/2010 |
| KR | 20140148424 A | 12/2014 |
| KR | 20150010737 A | 1/2015 |
| KR | 20160127429 A | 11/2016 |
| KR | 20170077774 A | 7/2017 |
| KR | 20170084318 A | 7/2017 |
| KR | 20170098987 A | 8/2017 |
| WO | 03048225 A2 | 6/2003 |
| WO | 2004037887 A2 | 5/2004 |
| WO | 2013057908 A1 | 4/2013 |
| WO | 2016047536 A1 | 3/2016 |

OTHER PUBLICATIONS

Aspin, et al., "9-Silafluorenyl Dichlorides as Chemically Ligating Coupling Agents and Their Applications in Peptide Syntheses," Angewandte Chemie, Oct. 2016, pp. 13833-13837, vol. 55, No. 4.
International Search Report for Application No. PCT/KR2019/010358 mailed Nov. 22, 2019, 3 pages.
Ren, et al., "A new π-conjugated star-shaped polymer comprising of full fluorene units: An efficient blue emitter without reduction of color purity undergoing an annealing," Synthetic Metals, Sep. 2, 2008, , pp. 29-35, vol. 159, Nos. 1-2.
Search Report dated Oct. 28, 2022 from the Office Action for Chinese Application No. 201980037200.5 issued Nov. 2, 2022, pp. 1-2.
Search Report for European Patent Application No. 19849171.4, dated Jun. 14, 2021. 2 pgs.

* cited by examiner

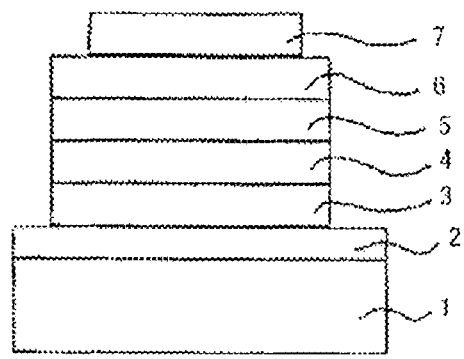

POLYMERS, USE THEREOF AS HOLE TRANSPORT MATERIAL, AND ORGANIC ELECTRONIC DEVICES COMPRISING SAME

CROSS-REFERENCE TO RELATED APPLICATION(S)

This application is a national phase entry under 35 U.S.C. § 371 of International Application No. PCT/KR2019/010358 filed Aug. 14, 2019, which claims priority from Japanese Patent Application No. 2018-153123 filed Aug. 16, 2018, all of which are incorporated herein by reference.

TECHNICAL FIELD

The present disclosure relates to a polymer including a fluorene derivative substituted with an aromatic amino group at a 4 or 5 position in the main chain as a repeating unit, a method of using the same as a hole transfer material, a hole injection material, a hole injection/transfer material, a host material of a light emitting layer, and/or a material of an electron blocking/exciton blocking layer, or the like, in an organic electronic device, and an organic electronic device including the polymer. As the organic electronic device, an electroluminescence device (organic EL device) is particularly preferred.

BACKGROUND ART

An organic electronic device is a device requiring transfer of charges between electrodes and organic material layers forming the device using holes and/or electrons. An organic electronic device may be largely divided into two types as follows depending on the operation principle. The device of the first type is a device in which excitons are formed in an organic material layer by photons entering into the device from an external light source, these excitons are separated into electrons and holes, these electrons and holes are each transferred to separate electrodes to generate electromotive force, and the device uses the electromotive force. The device of the second type is an electronic device in which a voltage is applied to two or more separate electrodes or a current is applied to the device to inject holes and/or electrons to an organic material semiconductor layer in contact with each of the electrodes, and the device is operated by the injected electrons and holes. Examples of the device of the first type include an organic solar cell and an organic photoconductor. Examples of the device of the second type include an organic light emitting device, more specifically, an organic electroluminescence (EL) device, and an organic transistor.

Among organic electronic devices, an organic EL device commonly has a structure including an anode, a cathode, and an organic material layer including a light emitting layer disposed between these electrodes. In the organic EL device, light emits from the light emitting material using energy of excitons generated by recombining holes and electrons injected from the anode and the cathode, respectively. Herein, the organic material layer of the organic EL device generally has a multilayer structure formed with a plurality of layers formed including different materials each provided with different functions in order to enhance properties of the organic EL device, for example, light emission efficiency, and the plurality of layers are formed with, for example, a hole injection layer, a hole transfer layer, a light emitting layer, an electron transfer layer, an electron injection layer and the like. However, in these layers, one layer may provide several functions, and accordingly, some of these layers may not be included. In addition to these organic material layers, a planarization layer for increasing planarity of the electrode surface, a hole blocking layer, an electron blocking layer and/or an exciton blocking layer for locking holes, electrons and/or excitons in the light emitting layer may also be included in the organic layer of the organic EL device.

When a voltage is applied between two electrodes in the organic EL device having such a structure, holes from an anode and electrons from a cathode are injected to an organic material layer, and when the injected holes and electrons bind, excitons having higher energy than ground state energy of the molecule are formed in a light emitting molecule, and light emits when these excitons fall back to the ground state. Such an organic EL device is a self-luminous light emitting device, and it is known that, compared to an existing liquid crystal device using a backlight, properties of high luminance, high efficiency, low driving voltage, wide viewing angle, high contrast, and high response rate are obtained.

In the organic EL device, materials used as an organic material layer may be divided into, depending on the function, a light emitting material, and a charge injection and transfer material such as a hole injection material, a hole transfer material, an electron transfer material and an electron injection material. In addition, the light emitting material may be divided into, depending on the light emitting color, blue, green and red light emitting materials, and yellow and orange light emitting materials for obtaining a better natural color. Meanwhile, when forming the light emitting layer with just one material, problems such that color purity decreases by a maximum light emission wavelength shifting to a long wavelength due to intermolecular interactions, or device efficiency decreases by an effect of light emission attenuation may occur, and in order to obtain high color purity of light emission and enhance light emission efficiency, host/impurity-based including a light emitting material and a host material may be used in the light emitting layer.

As a hole transfer material to be used in an organic layer of an organic EL device, aromatic amine compounds, for example, N,N'-bis(naphthalen-1-yl)-N,N'-bis(phenyl)-benzidine (NPB), N,N'-bis(3-methylphenyl)-N,N'-bis(phenyl)-benzidine (TPD), N,N'-di(1-naphthyl)-N,N'-diphenylbenzidine (α-NPD), 1,1-bis[4-[N,N-di(p-tolyl)amino]phenyl]cyclohexane (TAPC) or the like have been known so far.

Meanwhile, as a material capable of using a solution method such as a spin coating method in a device manufacturing process, hole transferring polymers have been studied so far. For example, Japanese Patent Application Laid-Open Publication No. 2015-519424 based on international application (International Patent Application Laid-Open Publication No. 2013/156125 号) describes, as an electron transfer material capable of forming an organic layer of an organic EL device using a spin coating method, a crosslinking polymer including an aromatic amino group in the main chain, and an organic EL device using the crosslinking polymer in a hole injection layer, and describes that lifetime and operating voltage of the device are superior compared to polymers used in the art.

Japanese Patent Application Laid-Open Publication No. 2015-516487 based on international application (International Patent Application Laid-Open Publication No. 2013/156129) describes a hole transferring polymer including an aromatic amino group in the main chain, and having a biphenyl group or a substituted fluorenyl group as an aromatic group in the side chain. In the same publication, it is described that the polymer is used in a hole transfer layer of an organic EL device, and the obtained organic EL device has excellent lifetime and operating voltage compared to polymers used in the art. Japanese Patent Application Laid-Open Publication No. 2015-514839 based on international application (International Patent Application Laid-Open Publication No. 2013/156130) describes a polymer including an aromatic amino group in the main chain, and having an aromatic substituent at an ortho position of the aromatic group of the side chain. In the same publication, it is described that the polymer is in a hole transfer layer of an organic EL device, and obtained the organic EL device has excellent lifetime and operating voltage compared to polymers used in the art.

PRIOR ART DOCUMENTS

Patent Documents

Patent Document 1: Japanese Patent Application Laid-Open Publication No. 2015-519424 based on international application Patent Document 2: Japanese Patent Application Laid-Open Publication No. 2015-516487 based on international application Patent Document 3: Japanese Patent Application Laid-Open Publication No. 2015-514839 based on international application

DISCLOSURE

Technical Problem

As described above, aromatic amine compounds having various chemical structures including polymers have been researched and developed as a hole transfer material for an organic electronic device, for example, an organic electroluminescence (EL) device, however, there are still needs for the development of materials having more superior properties or materials having novel chemical structures that have not been known to date. The present disclosure is directed to providing a novel material useful as a hole transfer material for an organic electronic device, particularly, an organic EL device.

Technical Solution

In view of the above, one embodiment of the present disclosure provides a polymer described below. The polymer of the present disclosure is suitable to use as a hole transfer material for an organic electronic device. Another embodiment of the present disclosure provides an organic electronic device, particularly an organic EL device, having an organic layer including the polymer of the present disclosure.

1. The polymer of the present disclosure is a polymer including a repeating unit represented by the following Formula (1) in 40 mol % to 100 mol % of the whole repeating unit forming the polymer.

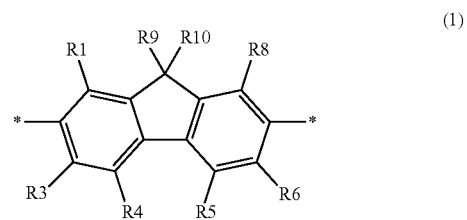

In Formula (1),
* represents a bonding site with a neighboring repeating unit or end group in the polymer chain,
R1, R3, R4, R5, R6 and R8 each independently represent a group selected from the group consisting of a hydrogen atom, a deuterium atom, a fluorine atom, a CN group, an NRaRb group (Ra and Rb independently represent a group selected from the group consisting of a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms), a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms,
however, at least one of R4 and R5 is an aromatic amino group represented by the following Formula (A) or (B),

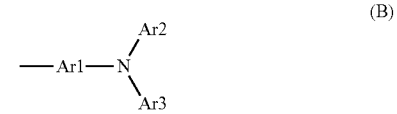

in Formulae (A) and (B),
Ar1 represents a substituted or unsubstituted arylene group having 6 to 30 ring-forming atoms, or a substituted or unsubstituted heteroarylene group having 5 to 30 ring-forming atoms,
Ar2 and Ar3 each independently represent a substituted or unsubstituted aryl group having 6 to 30 ring-forming atoms, or a substituted or unsubstituted heteroaryl group having 5 to 30 ring-forming atoms, and
R9 and R10 each independently represent a group selected from the group consisting of a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms; or R9 and R10 form, together with the carbon atoms in Formula (1) to which they bond, a substituted or unsubstituted cycloalkyl ring having 3 to 10 ring-forming atoms, or form a substituted or unsubstituted spirofluorene ring.

In addition, a group present at the end of the polymer and different from the repeating unit is not counted as the repeating unit forming the polymer. In addition, a unit derived from a compound used as a monomer when synthesizing the polymer and included in the polymer chain is included in the repeating unit even when it is an average of one or less per one molecule.

2. In another embodiment of the polymer of the present disclosure, the polymer of the present disclosure further includes, in addition to the repeating unit represented by Formula (1), at least one type of repeating units represented by the following Formula (2) to Formula (4), wherein a sum of the repeating unit represented by Formula (1) and the repeating units represented by Formula (2) to Formula (4) is from 60 mol % to 100 mol % of the whole repeating unit forming the polymer.

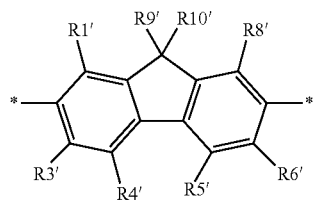

The repeating unit represented by Formula (2) has a different chemical structure from the repeating unit represented by Formula (1), in Formula (2),
* represents a bonding site with a neighboring repeating unit or end group in the polymer chain,
R1', R3', R4', R5', R6' and R8' each independently represent a group selected from the group consisting of a hydrogen atom, a deuterium atom, a fluorine atom, a CN group, an NRaRb group (Ra and Rb independently represent a group selected from the group consisting of a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms), a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms, and
R9' and R10' each independently represent a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms; or R9' and R10' form, together with the carbon atoms in Formula (2) to which they bond, a substituted or unsubstituted cycloalkyl ring having 3 to 10 ring-forming atoms, or a substituted or unsubstituted spirofluorene ring.

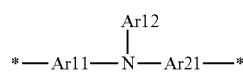

In Formula (3),
* represents a bonding site with a neighboring repeating unit or end group in the polymer chain, and
Ar12 represents a substituted or unsubstituted aryl group having 6 to 30 ring-forming atoms, or a substituted or unsubstituted heteroaryl group having 5 to 30 ring-forming atoms; and Ar11 and Ar21 each independently represent a substituted or unsubstituted arylene group having 6 to 30 ring-forming atoms.

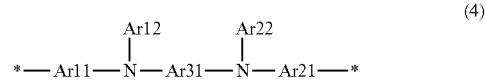

In Formula (4),
* represents a bonding site with a neighboring repeating unit or end group in the polymer chain, and
Ar12 and Ar22 each independently represent a substituted or unsubstituted aryl group having 6 to 30 ring-forming atoms, or a substituted or unsubstituted heteroaryl group having 5 to 30 ring-forming atoms, and Ar11, Ar21 and Ar31 each independently represent a substituted or unsubstituted arylene group having 6 to 30 ring-forming atoms.

3. In the polymer described above, the repeating unit represented by Formula (4) is preferably a repeating unit represented by the following Formula (5), or the repeating unit represented by Formula (4) preferably includes a repeating unit represented by Formula (5), that is, a part or all of the repeating unit represented by Formula (4) is preferably a repeating unit represented by Formula (5).

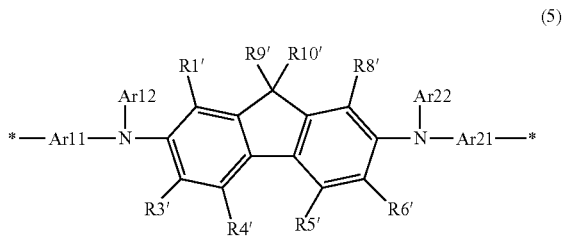

In Formula (5),
Ar11 and Ar21, and Ar12 and Ar22 each have the same meaning as defined in Formula (4), and
R1', R3', R4', R5', R6', R8', R9' and R10' each have the same meaning as defined in Formula (2).

4. The polymer according to one preferred embodiment of the present disclosure includes, in addition to the repeating unit represented by Formula (1), only the repeating unit represented by Formula (2) as the repeating units represented by Formula (2) to Formula (4). In this case, the polymer of the present disclosure is formed only with the repeating units of Formula (1) and Formula (2), or may include, in addition to the repeating units of Formula (1) and Formula (2), repeating units other than Formulae (3) and (4).

5. In the polymer including the repeating unit of Formula (1) and at least one type of the repeating units represented by Formula (2) to Formula (4) described above, the polymer chain is preferably formed by alternately linking the repeating unit of Formula (1) and at least one type of the repeating units represented by Formula (2) to Formula (4), or the polymer chain preferably includes a block in which the repeating unit of Formula (1) and at least one type of the repeating units represented by Formula (2) to Formula (4) are alternately linked.

6. The at least one type of the repeating units represented by Formula (2) to Formula (4) described above is preferably the repeating unit represented by Formula (2), and accordingly, as the polymer of the present disclosure, the polymer chain is preferably formed with the repeating unit of Formula (1) and the repeating unit represented by Formula (2) or formed by alternately linking these, or the polymer chain preferably includes a block in which the repeating unit of Formula (1) and the repeating unit represented by Formula (2) are alternately linked.

7. As for the repeating unit represented by Formula (1), in Formula (1), R1, R3, R6, R8, R4 not represented by Formula (A) or (B), and R5 not represented by Formula (A) or (B) are each independently a group selected from the group consisting of a hydrogen atom, a deuterium atom, an unsubstituted alkyl group having 1 to 30 carbon atoms, and an unsubstituted aryl group having 6 to 30 ring-forming atoms, R9 and R10 are each an aryl group having 6 to 30 ring-forming atoms unsubstituted or substituted with an alkyl group having 1 to 30 carbon atoms; or R9 and R10 form, together with the carbon atoms in Formula (1) to which they bond, a spirofluorene ring unsubstituted or substituted with an alkyl group having 1 to 30 carbon atoms, and Ar2 and Ar3 of Formulae (A) and (B) are each preferably an aryl group having 6 to 30 ring-forming atoms unsubstituted or substituted with an alkyl group having 1 to 30 carbon atoms, and Ar1 of Formula (B) is preferably an arylene group having 6 to 30 ring-forming atoms unsubstituted or substituted with an alkyl group having 1 to 30 carbon atoms.

8. As for the repeating unit represented by Formula (2), in Formula (2), R1', R3', R4', R5', R6' and R8' each independently represent a group selected from the group consisting of a hydrogen atom, a deuterium atom, and an aryl group having 6 to 30 ring-forming atoms unsubstituted or substituted with an alkyl group having 1 to 30 carbon atoms, and R9' and R10' each independently represent an unsubstituted alkyl group having 1 to 30 carbon atoms, or an aryl group having 6 to 30 ring-forming atoms unsubstituted or substituted with an alkyl group having 1 to 30 carbon atoms; or R9' and R10' preferably form, together with the carbon atoms of Formula (1) to which they bond, a cycloalkyl group having 3 to 6 ring-forming atoms unsubstituted or substituted with an alkyl group having 1 to 30 carbon atoms, or a spirofluorene ring unsubstituted or substituted with an alkyl group having 1 to 30 carbon atoms.

9. In one preferred embodiment of the present disclosure, the polymer of the present disclosure may include a repeating unit having a crosslinking group for polymer chain crosslinking in the polymer chain, may include a crosslinking group for polymer chain crosslinking at the polymer end, or may include a combination thereof. Accordingly, the polymer in this case is a crosslinking polymer having a crosslinking group.

10. The polymer, wherein preferred examples of the crosslinking group for polymer chain crosslinking described above is an alkenyl group, a group represented by the following formula, or a combination thereof:

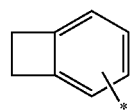

in the formula,
* represents a site bonding to the remaining part of the polymer.

The group represented by the above-mentioned formula may be selected from the groups represented by

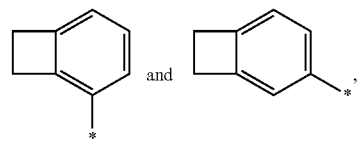 [SMILES: *c1cccc2c1CC2 ; *c1ccc2c(c1)CC2]

and the latter is particularly preferred.

11. The number of the repeating units of the polymer of the present disclosure described above is preferably an average of 10 to 1000 per one polymer molecule, but is not particularly limited to this range.

12. The present disclosure also provides a crosslinking polymer composition including a crosslinking polymer having a crosslinking group in the polymer chain and/or at the polymer end described above, and a crosslinking agent capable of crosslinking the polymer chain by reacting with the crosslinking group that the polymer has.

13. The present disclosure also provides a method of using the polymer as a hole transfer material for an organic electronic device, for example, an organic EL device. In other words, the present disclosure provides a hole transfer material for an organic electronic device including any one polymer described above. The polymer in this case may or may not be crosslinkable, but is preferably a crosslinking polymer.

14. In addition, the present disclosure also describes a method of using the crosslinking polymer composition including a crosslinking polymer having a crosslinking group and a crosslinking agent described above as a hole transfer material for an organic electronic device, for example, an organic EL device. In other words, the present disclosure provides a hole transfer material for an organic electronic device including the crosslinking polymer composition described above. This material crosslinks the crosslinking polymer using a crosslinking agent, and therefore, may form a film insoluble for an organic solvent.

15. In addition, the present disclosure provides an organic electronic device including a cured material of any one polymer of the present disclosure described above. In this case, the polymer of the present disclosure is included in one or more organic layers of the organic electronic device, for example, an organic EL device, and the organic layer may be one or more layers selected from the group consisting of a hole injection layer, a hole transfer layer, a light emitting layer, an electron blocking layer, an exciton blocking layer, a charge generating layer, a charge transfer layer and the like.

16. In addition, the present disclosure provides an organic electronic device including a crosslinked polymer obtained from the crosslinking polymer composition described above.

17. In addition, the present disclosure provides a method for manufacturing an organic electronic device by forming one or more organic layers on a substrate using the polymer of the present disclosure, and in the method, at least one organic layer of the organic electronic device is formed using a method including the following process.

The process includes,
1) a process of preparing a polymer solution by dissolving the polymer of the present disclosure in an organic solvent,
2) a process of using the polymer solution on a substrate, and
3) a process of forming a polymer thin film by evaporating the organic solvent, and when the polymer includes a crosslinking group, the process further includes a process of crosslinking the crosslinking group.

This method also includes, for example, a case in which one process overlaps the next process so that crosslinking of the crosslinking group starts before the organic solvent completely evaporates.

18. In addition, the present disclosure provides a method for manufacturing an organic electronic device by forming one or more organic layers on a substrate using the crosslinking polymer composition of the present disclosure described above, and in the method, at least one organic layer of the organic electronic device is formed using a method including the following process.

The process includes,
1) a process of preparing a solution including the crosslinking polymer composition described above in an organic solvent,
2) a process of using the solution on a substrate,
3) a process of forming a thin film including the crosslinking polymer and the crosslinking agent by evaporating the organic solvent, and
4) a process of reacting and crosslinking the crosslinking polymer and the crosslinking agent.

This method also includes, for example, a case in which one process overlaps the next process so that crosslinking between the crosslinking polymer and a crosslinking group of the crosslinking agent starts before the organic solvent completely evaporates.

Advantageous Effects

Using a polymer of the present specification is effective in increasing a device lifetime.

DESCRIPTION OF DRAWINGS

The FIGURE is a diagram illustrating a typical structure of an organic EL device.

REFERENCE NUMERAL

1. Substrate
2. Anode
3. Hole Injection Layer
4. Hole Transfer Layer
5. Organic Light Emitting Layer
6. Electron Transfer Layer
7. Cathode

MODE FOR DISCLOSURE

Hereinafter, the present disclosure will be described in more detail.

In the present specification, the term「polymer」is used to mean a compound including two or more repeating units regardless of the molecular weight. Accordingly, the「polymer」of the present disclosure also includes those commonly referred to as an oligomer.

Unless specified as linear alkyl, branched alkyl, cyclic alkyl (cycloalkyl) and the like, an「alkyl group」in the present specification includes a linear alkyl group, a branched alkyl group, and a cyclic alkyl group (cycloalkyl group). Examples of the linear or branched alkyl group include methyl, ethyl, n-propyl, isopropyl, n-butyl, isobutyl, tert-butyl, pentyl, hexyl, 2-ethylhexyl, octyl, heptyl, nonyl, decyl, undecyl, dodecyl, tridecyl, tetradecyl, pentadecyl, hexadecyl, heptadecyl and octadecyl groups, and possible linear and branched isomers thereof, but are not limited thereto. Examples of the cyclic alkyl group (cycloalkyl group) may include cyclopropyl, cyclobutyl, cyclopentyl, cyclohexyl, and alkyl groups including a partial structure of these cyclic alkyl such as cyclopentylmethyl, cyclopentylethyl, cyclohexylmethyl and cyclohexylethyl group, but are not limited thereto.

In the present specification, an「aryl group」refers to an aromatic hydrocarbon group, and includes both monocyclic and polycyclic groups. Examples of the aryl group may include phenyl, biphenyl, terphenyl, fluorenyl, spirobifluorenyl, naphthyl, anthracenyl, phenanthryl, acenaphthylenyl, fluoranthenyl, pyrenyl, chrysenyl, triphenylenyl, and perylenyl groups, however, the aryl group is not limited thereto. In the present specification, the fluorenyl group is also included in a broad aryl group or substituted aryl group. In the present specification, an「arylene group」refers to a divalent group in which one hydrogen atom is further removed from the「aryl group」.

In the present specification, a「heteroaryl group」refers to an aromatic heterocyclic group including one or more heteroatoms as a ring-forming atom, and the heteroaryl group includes both monocyclic and polycyclic groups. Examples of the heteroaryl group may include an indenyl group, a benzoindenyl group, a pyrrolyl group, an indolyl group, a carbazolyl group, a furanyl group, a benzofuranyl group, a dibenzofuranyl group (particularly, a dibenzofuran-1-yl group, a dibenzofuran-2-yl group, a dibenzofuran-3-yl group and a dibenzofuran-4-yl group), a thiophenyl group, a benzothiophenyl group, a dibenzothiophenyl group (particularly, a dibenzothiophen-1-yl group, a dibenzothiophen-2-yl group, a dibenzothiophen-3-yl group and a dibenzothiophen-4-yl group), a selenophenyl group, a benzoselenophenyl group, a dibenzoselenophenyl group (particularly, a dibenzoselenophen-1-yl group, a dibenzoselenophen-2-yl group, a dibenzoselenophen-3-yl group and a dibenzoselenophen-4-yl group), an imidazolyl group, a benzimidazolyl group, a triazolyl group, an oxazolyl group, an oxadiazolyl group, a thiazolyl group, a thiadiazolyl group, a pyridyl group, a pyrimidyl group, a triazinyl group, a quinolinyl group and a quinoxalinyl group, however, the heteroaryl group is not limited thereto. Accordingly, a polycyclic aromatic ring wherein one of the rings includes a heteroatom as a ring-forming atom is also included in the heteroaryl group. In the present specification, a「heteroarylene group」refers to a divalent group in which one hydrogen atom is further removed from the「heteroaryl group」.

In the specification of the present application, a term「substituted」of「substituted or unsubstituted」means, unless particularly defined otherwise, a group to which the term substituted is applied being further substituted with any one or more groups, and this applies to all substituted groups described in the present specification. The substituent in this case is not particularly limited, but is preferably selected from the group consisting of a deuterium atom, a cyano group, a fluorine group, an alkyl group having 1 to 30 carbon atoms, an aryl group having 6 to 30 ring-forming atoms, a heteroaryl group having 5 to 30 ring-forming atoms, a monoarylamino group or a diarylamino group (the aryl group is an aryl group having 6 to 30 ring-forming atoms), a monoheteroarylamino group and a diheteroarylamino group (the heteroaryl group is a heteroaryl group having 5 to 30 ring-forming atoms), an arylheteroarylamino group (the aryl group is an aryl group having 6 to 30 ring-forming atoms, and the heteroaryl group is a heteroaryl group having 5 to 30 ring-forming atoms), a trialkylsilyl group (the alkyl group is an alkyl group having 1 to 30 carbon atoms) and a triarylsilyl group (the aryl group is an aryl group having 6 to 30 ring-forming atoms). This substituent is particularly preferably selected from the group consisting of a deuterium atom, an aryl group having 6 to 30 ring carbon atoms, a monoarylamino group or a diarylamino group (the aryl group is an aryl group having 6 to 30 ring-forming atoms), and a triarylsilyl group (the aryl group is an aryl group having 6 to 30 ring-forming atoms). The alkyl, the aryl, and the heteroaryl each have the same meaning as described above.

Hereinafter, the polymer of the present disclosure will be described. As described above, the 「polymer」 of the present disclosure includes both an oligomer and a polymer.

The polymer of the present disclosure is a polymer in which 40 mol % to 100 mol % of the whole repeating unit forming the polymer is a repeating unit represented by the following Formula (1). Herein, a group present at the end of the polymer and different from the repeating unit is not counted as the repeating unit forming the polymer. For example, in a reaction synthesizing the polymer by reacting a dibromo compound and a bisboronic acid ester derivative described in the example, an end group of the polymer obtained when using the bisboronic acid ester derivative in excess with respect to the dibromo compound is a boronic acid ester group, and herein, the boronic acid ester group itself is not counted as the repeating unit. In addition, in a dibromo compound and a bisboronic acid ester, when using the dibromo compound in excess and reacting phenylboronic acid as an end blocking agent, the end group becomes a phenyl group, however, the phenyl group is not counted as the repeating unit forming the polymer herein. Meanwhile, a unit derived from a compound used as a monomer when synthesizing the polymer and included in the polymer chain is included in the repeating unit even when it is an average of one or less per one molecule.

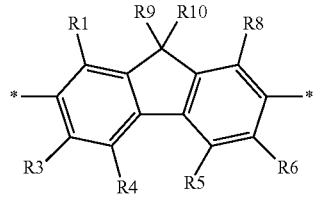

(1)

In Formula (1), * represents a bonding site with a neighboring repeating unit or end group in the polymer chain. The end group may be, for example, a group that a monomer used in the polymerization has, a group derived from the group by a chemical reaction, or, when using an end blocking agent, a group derived from the end blocking agent.

R1, R3, R4, R5, R6 and R8 each independently represent a group selected from the group consisting of a hydrogen atom, a deuterium atom, a fluorine atom, a CN group, an NRaRb group (Ra and Rb independently represent a group selected from the group consisting of a substituted or unsubstituted alkyl group having 1 to 30, preferably 1 to 12 and more preferably 1 to 8 carbon atoms, a substituted or unsubstituted aryl group having 6 to 30 ring-forming atoms, and a substituted or unsubstituted heteroaryl group having 5 to 30 ring-forming atoms), a substituted or unsubstituted alkyl group having 1 to 30, preferably 1 to 12 and more preferably 1 to 8 carbon atoms, a substituted or unsubstituted aryl group having 6 to 30 ring-forming atoms, and a substituted or unsubstituted heteroaryl group having 5 to 30 ring-forming atoms. Herein, each of the aryl groups is preferably a group independently selected from the group consisting of phenyl, biphenyl, terphenyl, fluorenyl, spirobifluorenyl, naphthyl, anthracenyl, phenanthryl, acenaphthylenyl, fluoranthenyl, pyrenyl, chrysenyl, triphenylenyl and perylenyl groups. In addition, each of the heteroaryl groups is preferably a group independently selected from the group consisting of an indenyl group, a benzoindenyl group, a pyrrolyl group, an indolyl group, a carbazolyl group, a furanyl group, a benzofuranyl group, a dibenzofuranyl group (particularly, a dibenzofuran-1-yl group, a dibenzofuran-2-yl group, a dibenzofuran-3-yl group and a dibenzofuran-4-yl group), a thiophenyl group, a benzothiophenyl group, a dibenzothiophenyl group (particularly, a dibenzothiophen-1-yl group, a dibenzothiophen-2-yl group, a dibenzothiophen-3-yl group and a dibenzothiophen-4-yl group), a selenophenyl group, a benzoselenophenyl group, a dibenzoselenophenyl group (particularly, a dibenzoselenophen-1-yl group, a dibenzoselenophen-2-yl group, a dibenzoselenophen-3-yl group and a dibenzoselenophen-4-yl group), an imidazolyl group, a benzimidazolyl group, a triazolyl group, an oxazolyl group, an oxadiazolyl group, a thiazolyl group, a thiadiazolyl group, a pyridyl group, a pyrimidyl group, a triazinyl group, a quinolinyl group and a quinoxalinyl group.

However, in Formula (1), at least one of R4 or R5 is an aromatic amino group represented by the following Formula (A) or (B):

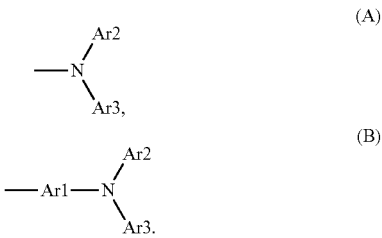

In Formulae (A) and (B), Ar1 represents a substituted or unsubstituted arylene group having 6 to 30 ring-forming atoms, or a substituted or unsubstituted heteroarylene group having 5 to 30 ring-forming atoms. Examples of the arylene group and the heteroarylene group are as described above. As the arylene group, a group selected from among phenylene, biphenylene, terphenylene, and naphthylene is particularly preferred.

Ar2 and Ar3 each independently represent a substituted or unsubstituted aryl group having 6 to 30 ring-forming atoms, or a substituted or unsubstituted heteroaryl group having 5 to 30 ring-forming atoms. Examples of the aryl group are as described above. As the aryl group, a group selected from among phenyl, biphenyl, terphenyl, fluorenyl, spirobifluorenyl, naphthyl, anthracenyl, phenanthryl, acenaphthylenyl, fluoranthenyl, pyrenyl, chrysenyl, triphenylenyl and perylenyl groups is preferred.

In other words, the polymer of the present disclosure includes a repeating unit represented by Formula (1) in which at least one of R4 or R5 is an aromatic amino group represented by Formula (A) or (B).

In Formula (1), R9 and R10 each independently represent a group selected from the group consisting of a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms, or R9 and R10 may form, together with the carbon atoms in Formula (1) to which they bond, a substituted or unsubstituted cycloalkyl ring having 3 to 10 ring-forming atoms, or form a substituted or unsubstituted spirofluorene ring. Examples of the alkyl group, the aryl group, and the heteroaryl group are as described above. R9 and R10 are preferably an alkyl group, particularly an unsubstituted alkyl group, or a substituted or unsubstituted aryl group, or R9 and R10 preferably form a substituted or unsubstituted spirofluorene ring together, and the substituent of the substituted aryl group and the substituted spirofluorene ring may include an alkyl group having 1 to 30, preferably 1 to 12 and more preferably 1 to 8 carbon atoms. The substituted or unsubstituted cycloalkyl ring that R9 and R10 may form together may include a substituted or unsubstituted cyclopropyl ring, substituted or unsubstituted cyclobutyl ring, substituted or unsubstituted cyclopentyl ring and substituted or unsubstituted cyclohexyl ring. The substituent in this case may include an alkyl group having 1 to 30, preferably 1 to 12 and more preferably 1 to 8 carbon atoms, and an aryl group having 6 to ring-forming atoms unsubstituted or substituted with an alkyl group having 1 to 30, preferably 1 to 12 and more preferably 1 to 8 carbon atoms.

When R9 and R10 described above form a spirofluorene ring with the carbon atoms to which they bond, the structure of Formula (1) may be represented by the following formula:

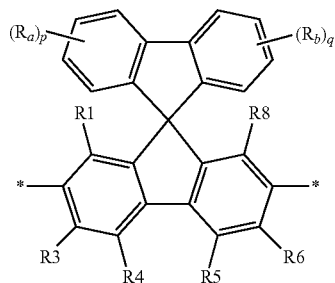

(in the formula, *, R1, R3, R4, R5, R6 and R8 have the same definitions as in Formula (1), Ra and Rb each independently represent a group selected from the group consisting of a substituted or unsubstituted alkyl group having 1 to 30, preferably 1 to 12 and more preferably 1 to 8 carbon atoms, a substituted or unsubstituted aryl group having 6 to 30 ring-forming atoms, and a substituted or unsubstituted heteroaryl group having 5 to 30 ring-forming atoms, and p and q each represent the number of Ra and Rb substituents and are independently a number of 0 to 4).

In a particularly preferred embodiment, R1, R3, R6, R8, and R4 or R5 not represented by Formula (A) or (B) in Formula (1) each independently a group selected from the group consisting of a hydrogen atom, a deuterium atom, an unsubstituted alkyl group having 1 to 30, preferably 1 to 12 and more preferably 1 to 8 carbon atoms, and an unsubstituted aryl group having 6 to 30 ring-forming atoms. In addition, R9 and R10 are preferably each independently a group selected from the group consisting of an alkyl group having 1 to 30, preferably 1 to 12 and more preferably 1 to 8 carbon atoms, and an aryl group having 6 to 30 ring-forming atoms unsubstituted or substituted with an alkyl group having 1 to 30, preferably 1 to 12 and more preferably 1 to 8 carbon atoms, or R9 and R10 may form a spirofluorene ring unsubstituted or substituted with an alkyl group having 1 to 30, preferably 1 to 12 and more preferably 1 to 8 carbon atoms together. In addition, Ar2 and Ar3 of Formulae (A) and (B) are each an aryl group having 6 to ring-forming atoms unsubstituted or substituted with an alkyl group having 1 to 30, preferably 1 to 12 and more preferably 1 to 8 carbon atoms, and Ar1 of Formula (B) is preferably an arylene group having 6 to 30 ring-forming atoms unsubstituted or substituted with an alkyl group having 1 to 30, preferably 1 to 12 and more preferably 1 to 8 carbon atoms. Specific examples of the alkyl and the aryl group may be selected from among the specific examples described above, but are not limited thereto.

A preferred example of the repeating unit represented by Formula (1) is a unit (or a unit substantially the same as these, but represented by a formula in which left and right of each of these formulae are inverted) represented by the following formula:

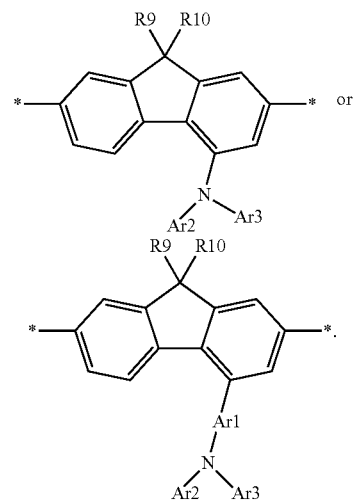

In the formulae, R9 and R10, Ar1, Ar2 and Ar3 have the same definitions as in Formula (1). Particularly preferred R9 and R10 are a group selected from among an unsubstituted alkyl group having 1 to 30, preferably 1 to 12 and more preferably 1 to 8 carbon atoms, and an unsubstituted aryl group having 6 to 30 ring-forming atoms, particularly, a phenyl group, a biphenyl group and a naphthyl group. R9 and R10 forming a spirofluorene ring unsubstituted or substituted with an alkyl group having 1 to 30, preferably 1 to 12 and more preferably 1 to 8 carbon atoms as described above is one preferred embodiment as well.

A particularly preferred unit among the above-described repeating units is a unit (or a unit substantially the same as these, but represented by a formula in which left and right of each of these formulae are inverted) represented by the following formula:

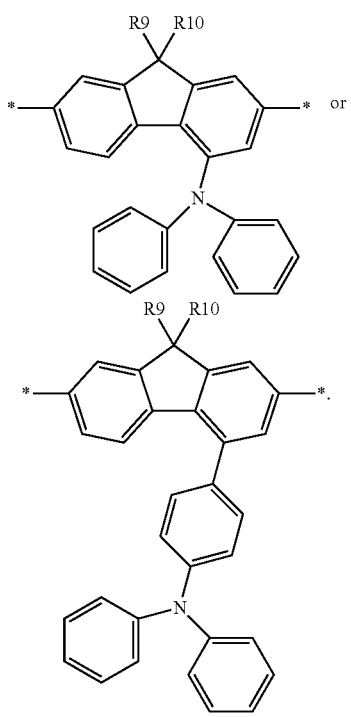

In these formulae, R9 and R10 have the same definitions as in Formula (1), however, R9 and R10 are preferably independently an unsubstituted alkyl group having 1 to 8 carbon atoms, a phenyl group, a biphenyl group or a naphthyl group, or R9 and R10 preferably form the spirofluorene ring unsubstituted or substituted with an alkyl group having 1 to 30, preferably 1 to 12 and more preferably 1 to 8 carbon atoms described above.

In another embodiment of the polymer of the present disclosure, the polymer of the present disclosure includes, in addition to the repeating unit represented by Formula (1), at least one type of repeating units represented by the following Formulae (2) to (4), particularly preferably Formula (2). A sum of the repeating unit represented by Formula (1) and the repeating units represented by Formulae (2) to (4) is preferably from 60 mol % to 100 mol % and more preferably from 80 mol % to 100 mol % of the whole repeating unit forming the polymer.

Formula (2) is as follows.

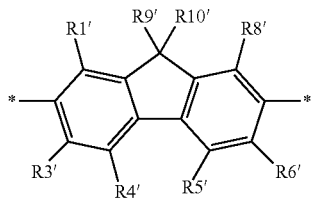

(2)

The repeating unit represented by Formula (2) has a different chemical structure from the repeating unit represented by Formula (1).

In Formula (2), * represents a bonding site with a neighboring repeating unit or a neighboring an end group in the polymer chain.

In Formula (2), R1', R3', R4', R5', R6' and R8' each independently represent a group selected from the group consisting of a hydrogen atom, a deuterium atom, a fluorine atom, a CN group, an NRaRb group (Ra and Rb independently represent a group selected from the group consisting of a substituted or unsubstituted alkyl group having 1 to 30, preferably 1 to 12 and more preferably 1 to 8 carbon atoms, a substituted or unsubstituted aryl group having 6 to 30 ring-forming atoms, and a substituted or unsubstituted heteroaryl group having 5 to 30 ring-forming atoms), a substituted or unsubstituted alkyl group having 1 to 30, preferably 1 to 12 and more preferably 1 to 8 carbon atoms, a substituted or unsubstituted aryl group having 6 to 30 ring-forming atoms, and a substituted or unsubstituted heteroaryl group having 5 to 30 ring-forming atoms. Herein, each of the aryl groups is preferably a group independently selected from among phenyl, biphenyl, terphenyl, fluorenyl, spirobifluorenyl, naphthyl, anthracenyl, phenanthryl, acenaphthylenyl, fluoranthenyl, pyrenyl, chrysenyl, triphenylenyl and perylenyl groups. In addition, each of the heteroaryl groups is preferably a group independently selected from among an indenyl group, a benzoindenyl group, a pyrrolyl group, an indolyl group, a carbazolyl group, a furanyl group, a benzofuranyl group, a dibenzofuranyl group (particularly, a dibenzofuran-1-yl group, a dibenzofuran-2-yl group, a dibenzofuran-3-yl group and a dibenzofuran-4-yl group), a thiophenyl group, a benzothiophenyl group, a dibenzothiophenyl group (particularly, a dibenzothiophen-1-yl group, a dibenzothiophen-2-yl group, a dibenzothiophen-3-yl group and a dibenzothiophen-4-yl group), a selenophenyl group, a benzoselenophenyl group, a dibenzoselenophenyl group (particularly, a dibenzoselenophen-1-yl group, a dibenzoselenophen-2-yl group, a dibenzoselenophen-3-yl group and a dibenzoselenophen-4-yl group), an imidazolyl group, benzimidazolyl group, a triazolyl group, an oxazolyl group, an oxadiazolyl group, a thiazolyl group, a thiadiazolyl group, a pyridyl group, a pyrimidyl group, a triazinyl group, a quinolinyl group and a quinoxalinyl group.

In Formula (2), R9' and R10' each independently represent a substituted or unsubstituted alkyl group having 1 to 30, preferably 1 to 12 and more preferably 1 to 8 carbon atoms, a substituted or unsubstituted aryl group having 6 to 30 ring-forming atoms, and a substituted or unsubstituted heteroaryl group having 5 to 30 ring-forming atoms, or R9' and R10' may form, together with the carbon atoms in Formula (2) to which they bond, a substituted or unsubstituted cycloalkyl ring having 3 to 10 ring-forming atoms, or a substituted or unsubstituted spirofluorene ring. Herein, examples of the alkyl group, the aryl group and the heteroaryl group are the same as described above. R9' and R10' are particularly preferably an alkyl group, particularly an unsubstituted alkyl group, or a substituted or unsubstituted aryl group, and the substituent of the substituted aryl group may include an alkyl group having 1 to 30, preferably 1 to 12 and more preferably 1 to 8 carbon atoms. The substituted or unsubstituted cycloalkyl ring that R9' and R10' may form together with the carbon atoms to which they bond may include substituted or unsubstituted cyclopropyl ring, substituted or unsubstituted cyclobutyl ring, substituted or unsubstituted cyclopentyl ring and substituted or unsubstituted cyclohexyl ring. The substituent herein may include an alkyl group having 1 to 30, preferably 1 to 12 and more preferably 1 to 8 carbon atoms, and an aryl group having 6 to 30 ring-forming atoms. In addition, the repeating unit when R9' and R10' of Formula (2) form a spirofluorene ring together with the carbon atoms to which they bond is represented by the following formula:

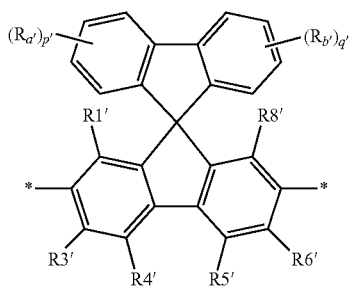

(in the formula, *, R1', R3', R4', R5', R6' and R8' have the same definitions as in Formula (2), and Ra' and Rb' each independently represent a group selected from the group consisting of deuterium, a substituted or unsubstituted alkyl group having 1 to 30, preferably 1 to 12 and more preferably 1 to 8 carbon atoms, a substituted or unsubstituted aryl group having 6 to 30 ring-forming atoms, and a substituted or unsubstituted heteroaryl group having 5 to 30 ring-forming atoms, and p' and q' each represent the number of substituents of Ra' and Rb', and are independently a number of 0 to 4).

As for the repeating unit represented by Formula (2), in Formula (2), R1', R3', R4', R5', R6' and R8' each independently represent a group selected from the group consisting of a hydrogen atom, a deuterium atom, and an aryl group having 6 to 30 ring-forming atoms unsubstituted or substituted with an alkyl group having 1 to 30, preferably 1 to 12 and particularly preferably 1 to 8 carbon atoms;

R9' and R10' each independently represent an unsubstituted alkyl group having 1 to 30, preferably 1 to 12 and particularly preferably 1 to 8 carbon atoms, or an aryl group having 6 to 30 ring-forming atoms unsubstituted or substituted with alkyl group having 1 to 30, preferably 1 to 12 and particularly preferably 1 to 8 carbon atoms, or R9' and R10' preferably form, together with the carbon atoms to which they bond, a cycloalkyl group having 3 to 6 ring-forming atoms unsubstituted or substituted with an alkyl group having 1 to 30, preferably 1 to 12 and more preferably 1 to 8 carbon atoms, or a spirofluorene ring unsubstituted or substituted with an alkyl group having 1 to 30, preferably 1 to 12 and more preferably 1 to 8 carbon atoms.

Formula (3) is as follows.

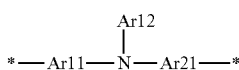 (3)

In Formula (3), * represents a bonding site with a neighboring repeating unit or end group in the polymer chain. The end group may be, for example, a group that a monomer used in the polymerization has, a group derived from the group using a known chemical reaction, or, when using an end blocking agent, a group derived from the end blocking agent.

In Formula (3), Ar12 represents a substituted or unsubstituted aryl group having 6 to 30 ring-forming atoms, or a substituted or unsubstituted heteroaryl group having 5 to 30 ring-forming atoms. Ar11 and Ar21 each independently represent a substituted or unsubstituted arylene group having 6 to 30 ring-forming atoms. Herein, each of the aryl groups is preferably a group independently selected from among phenyl, biphenyl, terphenyl, fluorenyl, spirobifluorenyl, naphthyl, anthracenyl, phenanthryl, acenaphthylenyl, fluoranthenyl, pyrenyl, chrysenyl, triphenylenyl and perylenyl groups. In addition, each of the heteroaryl groups is preferably a group independently selected from among an indenyl group, a benzoindenyl group, a pyrrolyl group, an indolyl group, a carbazolyl group, a furanyl group, a benzofuranyl group, a dibenzofuranyl group (particularly, a dibenzofuran-1-yl group, a dibenzofuran-2-yl group, a dibenzofuran-3-yl group and a dibenzofuran-4-yl group), a thiophenyl group, a benzothiophenyl group, a dibenzothiophenyl group (particularly, a dibenzothiophen-1-yl group, a dibenzothiophen-2-yl group, a dibenzothiophen-3-yl group and a dibenzothiophen-4-yl group), a selenophenyl group, a benzoselenophenyl group, a dibenzoselenophenyl group (particularly, a dibenzoselenophen-1-yl group, a dibenzoselenophen-2-yl group, a dibenzoselenophen-3-yl group and a dibenzoselenophen-4-yl group), an imidazolyl group, a benzimidazolyl group, a triazolyl group, an oxazolyl group, an oxadiazolyl group, a thiazolyl group, a thiadiazolyl group, a pyridyl group, a pyrimidyl group, a triazinyl group, a quinolinyl group and a quinoxalinyl group. Examples of the arylene group include an arylene group having a structure in which one hydrogen atom is further removed from the aryl group, and examples thereof may include phenylene, biphenylene, terphenylene, naphthylene and the like.

Formula (4) is as follows.

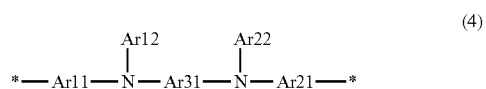 (4)

In Formula (4), * represents a bonding site with a neighboring repeating unit or end group in the polymer chain.

Ar12 and Ar22 each independently represent a substituted or unsubstituted aryl group having 6 to 30 ring-forming atoms, or a substituted or unsubstituted heteroaryl group having 5 to 30 ring-forming atoms; and Ar11, Ar21 and Ar31 each independently represent a substituted or unsubstituted arylene group having 6 to 30 ring-forming atoms.

Herein, specific examples of the aryl, the heteroaryl and the arylene are the same as the descriptions on Ar11, Ar21 and Ar12 provided above.

The repeating unit represented by Formula (4) may be a repeating unit in which a part or all thereof is represented by the following Formula (5).

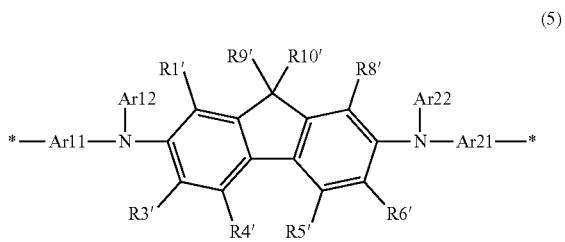 (5)

In Formula (5), Ar11 and Ar21, and Ar12 and Ar22 each have the same meaning as defined in Formula (4).

*, R1', R3', R4', R5', R6', R8', R9' and R10' each have the same meaning as defined in Formula (2).

Examples of a possible combination of the repeating units (1) to (4) described above included in the polymer of the present disclosure are described below:

(i) only the repeating unit of Formula (1) (the ratio is from 40 mol % to 100 mol %, preferably from 48 mol % to 100 mol % of the whole polymer);

(ii) the repeating unit of Formula (1)+ the repeating unit of Formula (2) (the ratio thereof as a sum is preferably from 60 mol % to 100 mol %, and more preferably from 80 mol % to 100 mol % of the repeating unit of the whole polymer);

(iii) the repeating unit of Formula (1)+ the repeating unit of Formula (3) (the ratio thereof as a sum is preferably from 60 mol % to 100 mol %, and more preferably from 80 mol % to 100 mol % of the repeating unit of the whole polymer); (iv) the repeating unit of Formula (1)+ the repeating unit of Formula (4) (the ratio thereof as a sum is preferably from 60 mol % to 100 mol %, and more preferably from 80 mol % to 100 mol % of the repeating unit of the whole polymer);

(v) the repeating unit of Formula (1)+ the repeating unit of Formula (2)+ the repeating unit of Formula (3) (the ratio thereof as a sum is preferably from 60 mol % to 100 mol %, and more preferably from 80 mol % to 100 mol % of the repeating unit of the whole polymer);

(vi) the repeating unit of Formula (1)+ the repeating unit of Formula (2)+ the repeating unit of Formula (4) (the ratio thereof as a sum is preferably from 60 mol % to 100 mol %, and more preferably from 80 mol % to 100 mol % of the repeating unit of the whole polymer);

(vii) the repeating unit of Formula (1)+ the repeating unit of Formula (3)+ the repeating unit of Formula (4) (the ratio thereof as a sum is preferably from 60 mol % to 100 mol %, and more preferably from 80 mol % to 100 mol % of the repeating unit of the whole polymer);

(viii) the repeating unit of Formula (1)+ the repeating unit of Formula (2)+ the repeating unit of Formula (3)+ the repeating unit of Formula (4) (the ratio thereof as a sum is preferably from 60 mol % to 100 mol %, and more preferably from 80 mol % to 100 mol % of the repeating unit of the whole polymer); and (ix) each of the combinations described above in which a part or all of the repeating unit (4) is a repeating unit represented by Formula (5).

The polymer of the present disclosure may include any repeating unit in addition to the repeating units represented by Formulae (1) to (4) (the repeating unit represented by Formula (4) includes the repeating unit represented by Formula (5) even without particular mention, and this also applies in the following descriptions). Examples of such an additional repeating unit may include, but are not limited to, repeating units of a polymer described in, in addition to the above-described Japanese Patent Application Laid-Open Publication No. 2015-519424 based on international application (International Patent Application Laid-Open Publication No. 2013/156125), Japanese Patent Application Laid-Open Publication No. 2015-516487 based on international application (International Patent Application Laid-Open Publication No. 2013/156129) and Japanese Patent Application Laid-Open Publication No. 2015-514839 based on international application (International Patent Application Laid-Open Publication No. 2013/156130), International Patent Application Laid-Open Publication No. 2013/057908, and/or International Patent Application Laid-Open Publication No. 2016/047536. In addition, as such an arbitrary repeating unit, repeating units having a crosslinking group for polymer chain crosslinking may also be used.

Among the combinations of the repeating units described above, (ii) including only the repeating unit represented by Formula (2) as the repeating units represented by Formulae (2) to (4) in addition to the repeating unit represented by Formula (1) is particularly preferred. In this case, the polymer of the present disclosure is formed only with the repeating units of Formula (1) and Formula (2), or may include repeating units other than Formulae (3) and (4) in addition to the repeating units of Formula (1) and Formula (2).

When examining a chemical structure of the polymer of the present disclosure, the polymer including the repeating unit of Formula (1) and at least one type of the repeating units represented by Formulae (2) to (4) described above preferably has the polymer chain in which the repeating unit of Formula (1) and at least one type of the repeating units represented by Formulae (2) to (4), preferably the repeating unit represented by Formula (2), are formed by being alternately crosslinked, or has the polymer chain including a block in which the repeating unit of Formula (1) and at least one type of the repeating units represented by Formulae (2) to (4), preferably the repeating unit represented by Formula (2), are formed by being alternately crosslinked.

In a particularly preferred embodiment of the present disclosure, the polymer of the present disclosure includes the repeating unit having a crosslinking group for polymer chain crosslinking in the polymer chain, or includes the crosslinking group for polymer chain crosslinking at the polymer end, or includes a combination thereof. Accordingly, the polymer herein is a crosslinking polymer having a crosslinking group. The crosslinking herein is preferably crosslinking by a covalent bond.

Examples of the crosslinking group that may be used in the polymer of the present disclosure may include any of those described in paragraphs 0089 to 0115 of Japanese Patent Application Laid-Open Publication No. 2015-519424 based on international application, paragraphs 0128 to 0149 of Japanese Patent Application Laid-Open Publication No. 2015-516487 based on international application, and page 11 of International Patent Application Laid-Open Publication No. 2016/047536 described above, however, the crosslinking group is not limited thereto. Particularly preferred examples of the crosslinking group for polymer chain crosslinking of the polymer of the present disclosure include an alkenyl group, a benzocyclobutene group represented by the following formula:

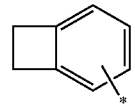

(in the formula, * represents a position bonding to the remaining part of the polymer, and is an arbitrary position on the benzene ring), and preferably a group represented by the following formula:

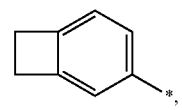

or a combination thereof. By introducing a repeating unit or an end group having these groups to the polymer chain, or by introducing a repeating unit or an end group having groups that are a precursor of these groups to the polymer chain and then converting the groups that are a precursor to target crosslinking groups, the crosslinking group may be introduced to the polymer chain. Examples of the method of introducing a benzocyclobutene group as the polymer end group may include a method of using compounds such as Compound MM1 or MM2 having a benzocyclobutene group described in the specification of US Patent Application Laid-Open Publication No. 2017/0283546, and may include a method of using Compound MM15 or MM16 to introduce a benzocyclobutene group to a repeating unit of the polymer. In addition, examples of the method of introducing an alkenyl group to the polymer may include a method of using boronic acid ester MM3 having an alkenyl group, bromide MM3-st1 or MM4-st2 having an alkenyl group described in the specification of US Patent Application Laid-Open Publication No. 2017/0283546, however, the method is not limited thereto. In addition, examples of the method of introducing a group that is a precursor of a crosslinking group to the polymer chain and converting it to a crosslinking group later may include a method of introducing a formyl group (aldehyde) to a polymer chain and converting it to a vinyl group using a Wittig reaction described in Japanese Patent Application Laid-Open Publication No. 2012-519214 based on international application.

Accordingly, examples of the repeating unit having a crosslinking group that may be used in the present disclosure may include one or more of R1', R3', R4', R5', R6', R8', R9' and R10' of the repeating unit represented by the following Formula (2):

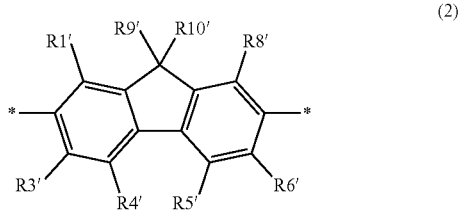

(2)

having a crosslinking group. Types of the crosslinking group are not particularly limited, however, an alkenyl group, particularly an end alkenyl group and/or a benzocyclobutene group are preferred. R1', R3', R4', R5', R6', R8', R9' and R10' other than the crosslinking group have the same definitions as in Formula (2).

In addition, when calculating the ratio of the repeating unit of Formula (1) and the ratio of the repeating units of Formula (1) and Formula (2) to the whole repeating unit in the polymer of the present disclosure, the repeating unit including a crosslinking group is not included in the repeating unit of Formula (2).

The method for preparing the polymer of the present disclosure may use chemical reactions known in the art, and is not particularly limited. However, for example, the polymer of the present disclosure may be prepared by preparing monomers each having a functional group capable of coupling aromatic groups at a site marked by `*` of the repeating units represented by Formulae (1) to (5), and coupling the above-described repeating units using these functional groups. Examples of such a coupling reaction may include, in addition to a method of using a so-called Suzuki-Miyaura coupling reaction including a method of forming a carbon-carbon bond through coupling aryl dihalide and aryldiboronic acid ester using a palladium catalyst described in Japanese Patent Application Laid-Open Publication No. 2015-519424 based on international application or the like mentioned as a prior art document, a method of a Yamamoto coupling reaction, a Stille coupling reaction or the like mentioned in paragraph [0053] of Japanese Patent Application Laid-Open Publication No. 2012-519214 based on international application. As for the repeating units other than the repeating units represented by Formulae (2) to (5), the same methods may be used to introduce the repeating units to the polymer main chain. When the polymer main chain has an amine nitrogen atom, a Hartwig-Buchwald coupling reaction mentioned in the same publication may also be used. These reactions are known in the art, and, in reference with the methods described in International Patent Application Laid-Open Publication No. 03/048225, International Patent Application Laid-Open Publication No. 2004/037887 and International Patent Application Laid-Open Publication No. 2004/037887 mentioned in Japanese Patent Application Laid-Open Publication No. 2012-519214 based on international application, those skilled in the art may prepare the polymer of the present disclosure without too much trial and error. In order to introduce an end group to the polymer of the present disclosure, a compound having one functional group capable of conducting the above-described coupling reaction is used as an end blocking agent, and, by reacting this compound with a polymer end at the end of a polymerization reaction, an end group may be introduced. By using an end blocking agent having a crosslinking group together with the functional group involving in the coupling reaction, a crosslinking group may be introduced to the polymer end. In addition, controlling a degree of polymerization of the polymer of the present disclosure, that is, controlling an average number of the repeating units included in one polymer molecule may be conducted by adjusting a molar ratio of different types of monomers used.

The end group of the polymer of the present disclosure may be, for example, a group that a monomer used in the polymerization has, a group derived from the group by a chemical reaction, or, when using an end blocking agent, a group derived from the end blocking agent. The end blocking agent of the polymer may be a compound for introducing the benzocyclobutene group or the alkenyl group described above to the polymer end, or, for example, a compound represented by Formula (1M) described in paragraph 0221 and claim 11 described in International Patent Application Laid-Open Publication No. 2016/047536, or a boronic acid derivative or bromide of benzocyclobutene described in the examples of International Patent Application Laid-Open Publication No. 2013/057908. In addition, the end blocking agent of the polymer not having a crosslinking group may be arylmonoboronic acid and arylmonobromide, and for example, may be phenylboronic acid or the like described in paragraph 0470 of the specification of US Patent Application Laid-Open Publication No. 2017/0283546.

The molecular weight of the polymer of the present disclosure is not particularly limited. As for the number of the repeating units that the polymer has, the number of the repeating units of the polymer of the present disclosure is preferably an average of 10 to 1000 per one polymer molecule, but is not particularly limited to this range. The number of repeating units that one polymer molecule has in average may be calculated considering, when using a method of synthesizing the polymer through a coupling reaction of arylbisboronic acid ester and aryl dihalide described in the example of the present specification, the amount of monomers actually consumed in the reaction from the molar ratio of each monomer used when synthesizing the polymer. Specifically, when the monomers used in the reaction each have two reaction groups involved in the polymerization, reaction groups used in excess stoichiometrically are present at both ends of each polymer molecule, and therefore, the number of moles that is half the number of moles of the excess reaction groups is considered to the same as the number of moles of the polymer molecule. From the number of moles of the polymer molecule and the number of moles of the monomers used in the polymerization reaction, an average value of the repeating units included in one polymer molecule may be obtained. In the polymer of the present disclosure, the number of the repeating units per one molecule obtained as above is preferably from 10 to 1000. This number of repeating units include repeating units having the crosslinking group, however, the end group is not included in the repeating unit.

The polymer of the present disclosure may or may not have a crosslinking group in the polymer chain and/or at the polymer end, however, when the polymer of the present disclosure has a crosslinking group, a crosslinking agent capable of crosslinking the polymer chain by reacting with the crosslinking group and the polymer of the present disclosure may be combined to be used as a curable polymer composition. In addition, when the polymer of the present disclosure has a crosslinking group capable of self-crosslinking or a combination of two or more types of crosslinking groups capable of producing a crosslinking reaction, for example, when the polymer has an alkenyl group and a benzocyclobutene group, the use of the crosslinking agent is not absolutely required, however, a crosslinking agent may be additionally used. In this example, a compound having two or more groups independently selected from a benzocyclobutene group and an alkenyl group in one molecule may be used, a compound having two benzocyclobutene groups in one molecule, a compound having two alkenyl groups in one molecule, and the like may be included as a crosslinking agent. When the polymer has only, for example, a benzocyclobutene group as a crosslinking group, a compound having two or more alkenyl groups in one molecule may be used as a crosslinking agent. Generally, when the polymer of the present disclosure has a crosslinking group, a compound capable of polymer chain crosslinking through forming a chemical bond by reacting with the crosslinking group that the polymer has may be used as a crosslinking agent of the polymer, and the use of which curing agent for a specific crosslinking group may be readily determined by those skilled in the art based on technological common sense. For crosslinking groups known to be capable of a crosslinking reaction through irradiation of an electron beam, ultraviolet rays, X-rays, microwaves or the like, the energy rays described above may be irradiated instead of using a crosslinking agent, or together with the use of a crosslinking agent.

Accordingly, the present disclosure also provides a crosslinking polymer composition including a crosslinking polymer having a crosslinking group in the polymer chain and/or at the polymer end described above, and a crosslinking agent capable of polymer chain crosslinking by reacting with the crosslinking group that the polymer has. When the crosslinking polymer composition is coated on a substrate and the composition includes an organic solvent, a film insoluble in an organic solvent may be formed by evaporating the organic solvent, and crosslinking the crosslinking group therewith.

The polymer of the present disclosure has an arylamino group in the side chain, and may be used as a hole transfer material, particular, a hole transfer material of an organic electronic device, particularly, an organic EL device. Accordingly, the present disclosure also provides an organic electronic device including the above-described polymer as a hole transfer material. Examples of an organic layer capable of using the polymer of the present disclosure may include one or more layers selected from among a hole injection layer, a hole transfer layer, a light emitting layer, an electron blocking layer, an exciton blocking layer, a charge generating layer, a charge transfer layer and the like. When using the polymer of the present disclosure in a light emitting layer, the polymer may be used as a host material. When the polymer of the present disclosure has a crosslinking group, an organic layer having excellent organic solvent resistance including a crosslinked polymer may be formed by crosslinking the polymer in the organic layer of an organic electronic device.

[Application of Polymer of the Present Disclosure]

As described above, the polymer having an arylamino group of the present disclosure is suitable to be used as a hole transfer material, particularly, a hole transfer material for an organic electronic device. As the organic electronic device, an electroluminescence device (organic EL device) is particularly preferred. Accordingly, the present disclosure also provides a method of using the polymer as a hole transfer material of an organic electronic device, particularly, an organic EL device. The polymer of the present disclosure to be used as a hole transfer material in the organic electronic device may or may not be a crosslinking polymer, but is preferably a crosslinking polymer. By crosslinking the polymer, a film substantially insoluble in an organic solvent may be formed, and therefore, an adverse effect that the polymer layer receives from the organic solvent may be eliminated or reduced even when using a solution method using an organic solvent such as a spin coating method in laminating a new organic layer on the organic layer formed with the polymer. When the polymer of the present disclosure has a crosslinking group, a crosslinking polymer composition including the polymer of the present disclosure and a crosslinking agent is prepared, and a solution of this composition, generally, a solution dissolved in an organic solvent, is applied on a substrate to form a film substantially insoluble in an organic solvent through removing a solvent and conducting a crosslinking reaction of the polymer.

[Organic Electronic Device]

The organic electronic device using the polymer of the present disclosure may be any electronic device known in the art using an organic material, and although not limited to a specific electronic device, may be a device selected from the group consisting of an organic light emitting device, an organic solar cell, an organic photoconductor (OPC) drum and an organic transistor. Particularly, the device of the present disclosure is preferably an organic light emitting device, particularly, an organic EL device. The polymer of Formula (1) of the present disclosure is, as described above, useful as a hole transfer material to be used in an organic electronic device. The hole transfer material of the present disclosure may be included in one or more organic layers of an organic electronic device, and the organic layer may be a hole injection layer, a hole transfer layer, a light emitting layer, particularly, a host material of a light emitting layer, an electron blocking layer, an exciton blocking layer, a charge generating layer, a charge transfer layer and the like.

[Organic Electroluminescence Device (Organic EL Device)]

An organic EL device generally includes a first electrode, a second electrode, and one or more organic material layers disposed therebetween, and at least one of the first electrode and the second electrode is a light transmitting electrode.

When injecting holes from an anode and injecting electrons from a cathode to an organic layer by applying a voltage between these two electrodes, the holes and the electrons recombine in the organic material layer, and a luminant included in the organic material layer emits light using energy of excitons generated by the recombination. An organic EL device has a structure of taking out light emission, which is from the organic material layer, from the light transmitting electrode side. A device structure of the organic EL device is not limited to one, and various device structures have been proposed. As for the light emission type, a top emission-type, a bottom emission-type, a dual emission (dual light emission)-type and the like are known. The organic material layer of the organic EL device of the present disclosure may have a single layer structure formed with one layer, but may also have a multilayer structure of two or more layers including a light emitting layer. When the organic material layer of the organic EL device of the present disclosure has a multilayer structure, the structure may be a structure in which, for example, a hole injection layer, a hole transfer layer, a light emitting layer, an electron transfer layer and the like are laminated. In addition, it is known that various layers such as a planarization layer for planarizing an electrode surface, a hole blocking layer, an electron blocking layer and an exciton blocking layer may be installed to enhance properties of the organic EL device. The polymer of Formula (1) of the present disclosure may be used in organic EL devices with all light emission types and structures. Accordingly, in the organic EL device including the polymer of Formula (1) of the present disclosure, the light emission type and the device structure is not limited to a specific type and a specific structure. In addition, a fluorescent light emission type, a phosphorescent light emission type and a delayed fluorescent light emission type are known as the organic EL device depending on a light emitting mechanism of the light emitting material, however, the polymer of Formula (1) of the present disclosure may be used in an organic EL device of any type.

A typical structure of an organic EL device is illustrated in the FIGURE. In the FIGURE, 1 represents a substrate, 2 represents an anode, 3 represents a hole injection layer, 4 represents a hole transfer layer, 5 represents an organic light emitting layer, 6 represents an electron transfer layer, and 7 represents a cathode. Typically, the organic EL device having a structure as in the FIGURE is referred to as an organic EL device in a normal direction structure. The organic EL device of present disclosure may have such a normal direction structure, but is not limited thereto, and may be an organic EL device having an inverse direction structure, that is, a structure in which a substrate, a cathode, an electron transfer layer, an organic light emitting layer, a hole transfer layer, a hole injection layer and an anode are consecutively laminated. In addition, some layers may be excluded from a plurality of these organic layers. In addition, the structure of the organic EL device of present disclosure is not limited to the above-described device structure, and any known device structure as a structure of an organic EL device may be included.

The polymer of Formula (1) of the present disclosure may be used as an organic material injecting and/or transferring holes in a hole injection layer injecting holes to an organic layer from an electrode, a hole transfer layer transferring holes in an organic layer, and a hole injection and transfer layer having functions of both in an organic electronic device. In addition, the polymer of Formula (1) may also be used as a material of an electron blocking layer, a material of an exciton blocking layer, and/or a host material of a light emitting layer. Accordingly, when the organic EL device according to the present disclosure has a multilayer-structured organic material layer, the polymer of Formula (1) may be used as a material forming one or more layers selected from among a hole injection layer, a hole transfer layer, a light emitting layer, an electron blocking layer and an exciton blocking layer. Among these, when using the polymer of the present disclosure in a light emitting layer, the polymer is preferably used as a host material for a light emitting dopant.

The organic EL device according to the present disclosure may be manufactured using known organic EL device manufacturing methods and materials used in an organic EL device except that the polymer of Formula (1) is used in an organic layer. For example, the organic EL device according to the present disclosure may be manufactured by forming an anode on a substrate by depositing a metal, an alloy or a metal oxide having conductivity, and a combination thereof using a physical vapor deposition (PVD) method such as sputtering or e-beam evaporation, forming an organic material layer including one or more layers selected from among a hole injection layer, a hole transfer layer, a light emitting layer, an electron transfer layer and the like thereon, and then depositing a material capable of being used as a cathode thereon. In addition to such a method, the organic EL device may also be manufactured by consecutively depositing a cathode material, an organic material layer and an anode material on a substrate in order to manufacture an organic EL device in an inverse direction structure as described above. In addition, some of the above-described organic material layers may not be included, and organic material layers other than the above-described organic material layers may be added.

As a material for the anode, using materials having large work function is normally preferred so that hole injection to an organic material layer is smooth. Specific examples of the anode material used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

As a material for the cathode, using materials having small work function is normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer-structured materials such as LiF/Al or $LiO_2$/Al, and the like, but are not limited thereto.

As a material of the hole injection layer, the polymer of Formula (1) of the present disclosure may be used, however, when using the polymer of Formula (1) in a hole transfer layer, a light emitting layer or the like, compounds other than the polymer of Formula (1) may also be used as a material of the hole injection layer either with the polymer of Formula (1) or instead of the polymer of Formula (1). The hole injection material is a material capable of smoothly receiving holes from an anode at a low voltage, and the highest occupied molecular orbital (HOMO) of the hole injection material is preferably in between the work function of an anode material and the HOMO of an organic material layer on an opposite side of the anode adjacent to the hole injection layer. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

As a material of the hole transfer layer, the polymer of Formula (1) of the present disclosure may be used, however, when using the polymer of Formula (1) in a hole injection layer, a light emitting layer or the like, compounds other than the polymer of Formula (1) may also be used as a material of the hole transfer layer either with the polymer of Formula (1) or instead of the polymer of Formula (1). The hole transfer material is a material capable of receiving holes from an anode or a hole injection layer and transferring the holes to a light emitting layer, and materials having high hole mobility are suited. Specific examples thereof include arylamine-based compounds; carbazole-based compounds; anthracene-based compounds; pyrene-based compounds; conductive polymers, block copolymers having conjugated parts and non-conjugated parts together, and the like, but are not limited thereto.

The light emitting material is a material capable of radiating light in a visible region by receiving holes and electrons transferred from a hole transfer layer and an electron transfer layer, respectively, and recombining the holes and the electrons and using energy of excitons generated herein, and materials having favorable quantum efficiency for fluorescent light emission or phosphorescent light emission are preferably used. Specific examples of the light emitting material include 8-hydroxy-quinoline aluminum complexes ($ALq_3$); carbazole-based compounds; dimerized styryl compounds; bis-methyl-8-hydroxyquinolineparaphenylphenol aluminum complexes (Balq); 10-hydroxybenzoquinoline-metal compounds; benzoxazole-, benzothiazole- and benzimidazole-based compounds; anthracene-based compounds; pyrene-based compounds; poly(p-phenylenevinylene) (PPV)-based polymers; spiro compounds; polyfluorene, rubrene; perylene-based compounds and the like, but are not limited thereto. The light emitting layer may be formed with the light emitting material only, or may be formed by, using the light emitting material as a light emitting dopant, combining the light emitting material with a host material. In an organic EL device, combining a light emitting material with a host material is a well-known method.

The electron transfer material is a material capable of smoothly receiving electrons from a cathode and transferring the electrons to a light emitting layer, and using materials having high electron mobility is preferred. Specific examples of the electron transfer material include Al complexes of 8-hydroxyquinoline; complexes including $Alq_3$; organic radical compounds; hydroxyflavon-metal complexes; anthracene-based compounds; pyrene-based compounds; benzoxazole-, benzothiazole- and benzimidazole-based compounds; pyridine-based compounds; phenanthroline-based compounds; quinoline-based compounds; quinazoline-based compounds and the like, but are not limited thereto. In addition, the electron transfer layer may also be formed by doping a metal or a metal compound to these compounds.

In addition to each of the above-described layers, a layer selected from among a planarization layer for planarizing an electrode surface; a hole blocking layer, an electron blocking layer and an exciton blocking layer for locking holes, electrons and excitons in a target organic layer may also be used in the organic EL device as necessary, and such a technology is a known technology. In addition thereto, known technologies relating to organic EL devices may be applied to the organic EL device including the polymer of Formula (1) of the present disclosure.

[Method for Forming Organic Material Layer]

As the method for forming an organic material layer of an organic electronic device, methods known in the art may be used. With low molecular organic materials, a solution method such as spin coating, dip coating, doctor blade coating, screen printing, inkjet printing or heat transfer method may be used in addition to vacuum deposition as the method for forming the organic material layer. In addition, for different organic layers, a solution method and a deposition method may be used as a combination.

However, for forming an organic layer including the polymer of the present disclosure, a solution method is preferably used. Accordingly, in one method for manufacturing an organic electronic device including the polymer of the present disclosure in an organic layer, at least one organic layer of the organic electronic device is preferably formed using a method including the following process.

a process of preparing a polymer solution by dissolving the polymer of the present disclosure in an organic solvent, a process of using the polymer solution on a substrate, a process of forming a polymer thin film by evaporating the organic solvent, and when the polymer includes a crosslinking group, a process of crosslinking the crosslinking group.

The process may also include additional processes.

In addition, in the present specification, the thickness of the ⌈thin film⌋ is not particularly limited, but is a thickness required for an organic film forming the organic electronic device.

Another method for forming an organic layer including the polymer of the present disclosure to manufacture an organic electronic device is a method for forming one or more organic layers on a substrate using a curable polymer composition including the crosslinking polymer of the present disclosure described above and a crosslinking agent. In the method, at least one organic layer of the organic electronic device is preferably formed using a method including the following process.

a process of preparing a solution including a crosslinking polymer composition including the crosslinking polymer having a crosslinking group of the present disclosure and a crosslinking agent in an organic solvent, a process of using the solution on a substrate, a process of forming a thin film including the crosslinking polymer and the crosslinking agent by evaporating the organic solvent, and a process of reacting and crosslinking the crosslinking polymer and the crosslinking agent.

The process may also include additional processes.

In the two methods, the organic solvent for dissolving the polymer or the polymer and the crosslinking agent is not particularly limited, and any organic solvent capable of dissolving the target polymer or polymer and crosslinking agent may be used. Examples of the organic solvent that may be used include, under the condition of dissolving the polymer, or the polymer and the crosslinking agent, hydrocarbon-based solvents such as toluene and xylene, ether-based solvents such as tetrahydrofuran and ethylene glycol diethyl ether, ketone-based solvents such as methyl ethyl ketone, ester-based solvents such as ethyl acetate and butyl acetate, or mixtures thereof.

As the method of applying the organic solution of the polymer or the polymer composition on a substrate, the above-described solution method such as a method of a spin coating method or an inkjet printing method may be used, however, the method is not limited thereto.

The method of evaporating the organic solvent is not particularly limited, however, a method of heating under normal pressure or vacuum, or evaporating a solvent under normal pressure or vacuum may be included.

As for the method and the condition for crosslinking the crosslinking group of the polymer, or the method and the condition for progressing the reaction between the polymer and the crosslinking agent, known methods and conditions may be used depending on the type of the crosslinking group. Although varying depending on the properties of the crosslinking group, a method of heating a film including the polymer or the polymer and the crosslinking agent, and a method of irradiating an electron beam, ultraviolet rays, X-rays, microwaves or the like on a film including the polymer may be generally included. In the reaction crosslinking the crosslinking group of the polymer, or the reaction between the crosslinking group of the polymer and the crosslinking agent, the crosslinking reaction may also be progressed in a process of evaporating the organic solvent by heating when the crosslinking group is crosslinked by heating. Accordingly, the method for forming the organic layer also includes a case of progressing one or more processes overlapping the next process.

Using the hole transfer properties, the polymer of Formula (1) according to the present disclosure may be used as a material for, without being limited to the organic EL device described above, other organic electronic devices, for example, devices such as an organic solar cell, an organic photoconductor, an organic photosensor or an organic transistor. Operating principles and device structures of these devices are known in the art.

Hereinafter, results of comparative examples and preferred examples will be described in order to illuminate the present disclosure, however, the present disclosure is not limited to the following examples.

EXAMPLE

Synthesis Example (1) Synthesis of Compound a

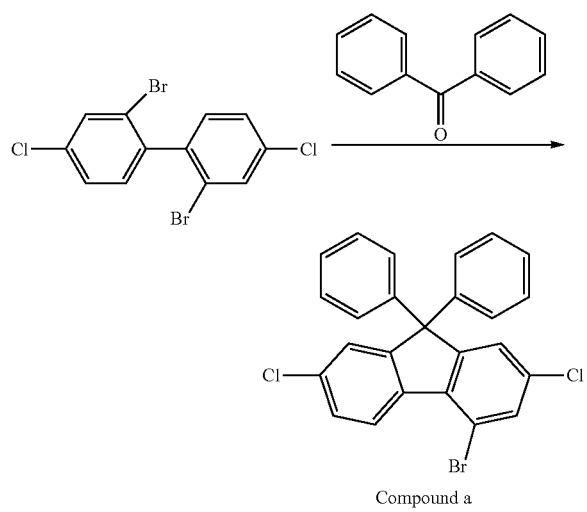

Compound a

In a flask dried by heating, 2,2'-dibromo-4,4'-dichlorobiphenyl (58 g, 152 mmol) (this may be synthesized in accordance with the method described in Angewandte Chemie, International Edition, 13833-13837, 2016) was dissolved in anhydrous THF (300 ml). The mixture was cooled to −78° C. At this temperature, a 15% solution of n-BuLi in hexane (75 ml, 119 mmol) was slowly added to the mixture by dropping (approximately 1 hour).

The reaction mixture was further stirred for 1 hour at −70° C. A solution obtained by dissolving benzophenone (21.8 g, 119 mmol) in THF (100 ml) was added to the reaction mixture at −70° C. by dropping. When the addition was finished, the reaction mixture was slowly warmed to room temperature, deactivated with $NH_4Cl$, and the solvent was evaporated using a rotary evaporator. To the solvent-evaporated liquid, acetic acid (510 ml) was carefully added, and then fuming hydrochloric acid (100 ml) was added thereto.

The reaction mixture was heated to 75° C., and kept for 4 hours at this temperature. White solids were precipitated during the time. Then, the reaction mixture was cooled to room temperature, and the precipitated solids were separated by suction filtration and washed with methanol.

The residue was dried at 40° C. under vacuum. The yield of the compound was 30.1 g (64.6 mmol, 54%).

(2) Synthesis of Compound A

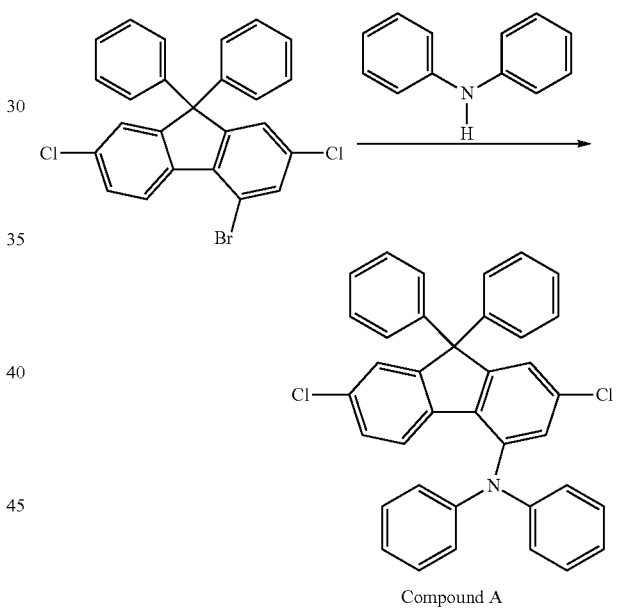

Compound A

Diphenylamine (9.0 g, 53 mmol) and Compound a (27.0 g, 58 mmol) were dissolved in toluene (500 ml). The solution was degassed and saturated with $N_2$. Then, a 1 M toluene solution of tri-tert-butylphosphine (5.3 ml, 5.3 mmol) and palladium(II) acetate (0.6 g, 2.65 mmol) were added thereto. Subsequently, sodium tert-butoxide (12.7 g, 132.23 mmol) was added thereto. The reaction mixture was heated to boil for 3 hours under a protective atmosphere.

The reaction mixture was then partitioned using toluene and water, the organic phase was washed three times with water, dried with $Na_2SO_4$, then filtered, and the solvent was evaporated using a rotary evaporator.

The crude product was filtered through silica gel using toluene, and then the filtrate was concentrated, and the remaining residue was recrystallized with heptane/toluene, and lastly sublimed under high vacuum.

The yield of Compound A was 23.0 g (41.5 mmol, 79%).

(3) Synthesis of Compound B

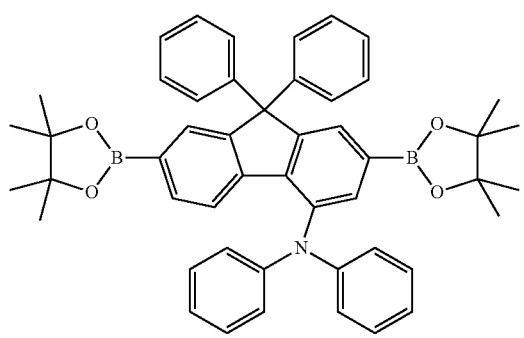

Compound B

Compound A (17.8 g, 32.1 mmol), bis(pinacolato)diborane (24.4 g, 96.3 mmol), potassium acetate (12.6 g, 130 mmol) and 1,1-bis(diphenylphosphino)ferrocenepalladium (II) dichloride (0.52 g, 0.6 mmol) were heated under reflux for 2 days in THF (1 L) while vigorously stirring.

The reaction mixture was filtered through CELITE® at room temperature. The solvent was removed under vacuum, and the remaining solids were recrystallized with acetonitrile. The generated solids were separated by filtration, and vacuum dried.

The yield of Compound B was 23.0 g (31.2 mmol, 97%).

(4) Synthesis of Compound C

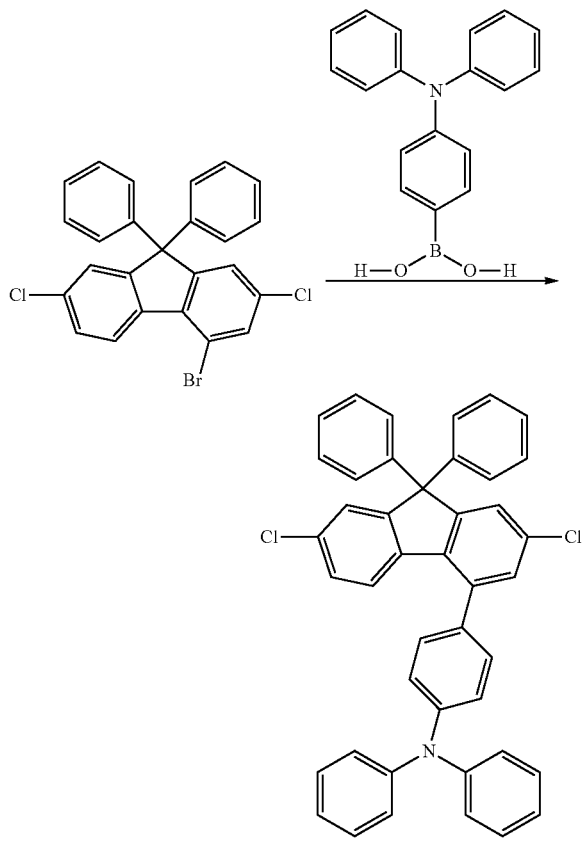

Compound C

Under the argon atmosphere, a 2 M aqueous $Na_2CO_3$ solution (75 ml, 150 mmol) was added to a mixture of Compound a (23.3 g, 50 mmol), triphenylamine-4-boronic acid (15.2 g, 53 mmol), $Pd(PPh_3)_4$ (1.16 g, 1.00 mmol), toluene (100 ml) and dimethoxyethane (100 ml), and the obtained mixture was refluxed for 10 hours by heating and stirring.

After the reaction, the reaction mixture was cooled to room temperature, and extracted with dichloromethane using a separatory funnel. The organic layer was dried with $MgSO_4$, filtered, and concentrated. The remaining concentrate was purified using column chromatography. The yield of Compound C was 23.3 g (37 mmol, 74%).

(5) Synthesis of Compound D

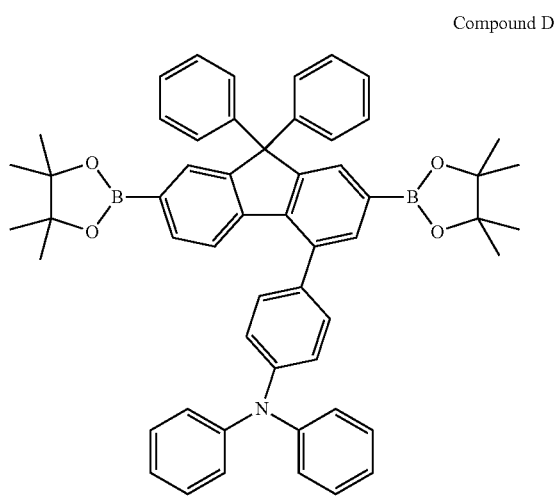

Compound D

Compound C (20.2 g, 32.1 mmol), bis(pinacolato)diborane (24.4 g, 96.3 mmol), potassium acetate (12.6 g, 130 mmol) and 1,1-bis(diphenylphosphino)ferrocenepalladium (II) dichloride (0.52 g, 0.6 mmol) were heated under reflux for 2 days in THF (1 L) while vigorously stirring.

The reaction mixture was filtered through CELITE® at room temperature. The solvent was removed under vacuum, and the remaining solids were recrystallized with acetonitrile. The generated solids were separated by filtration, and vacuum dried.

The yield of Compound D was 25.0 g (30.8 mmol, 96%).

[Synthesis of Polymer]

The following MM11 to MM15 were used to synthesize the polymer of the present disclosure. These compounds are described in the specification of US Patent Application Laid-Open Publication No. 2017/0283546 A1, and the synthesis methods and the like may be referred to this publication.

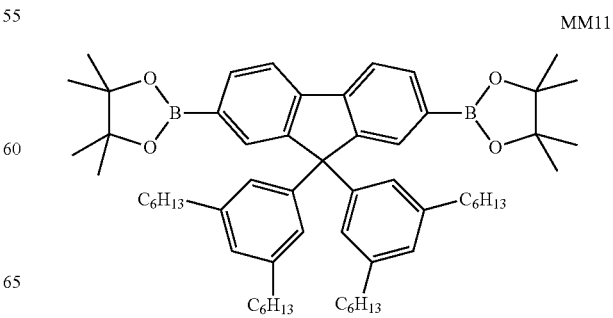

MM11

-continued

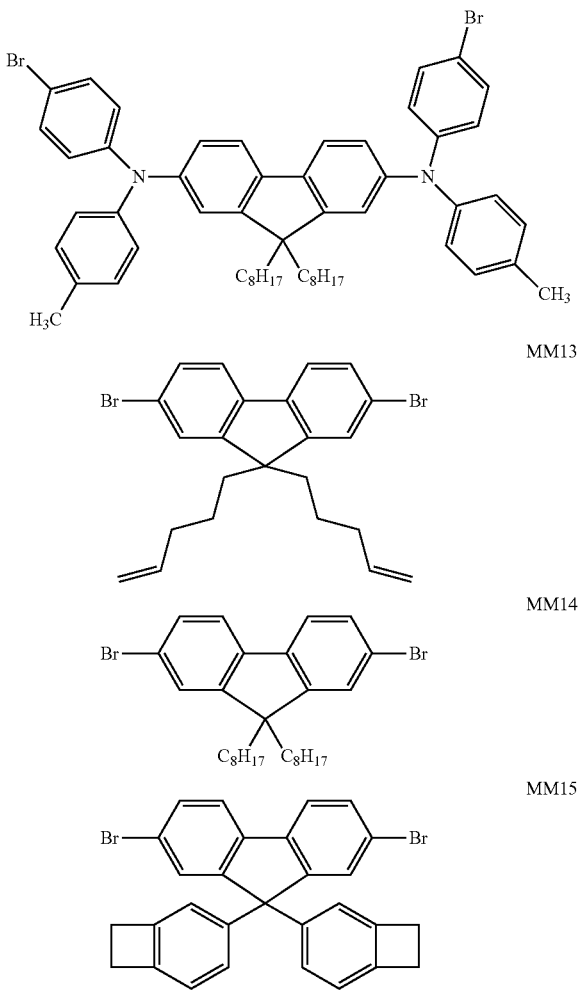

In addition, MM1 is a compound represented by the following formula:

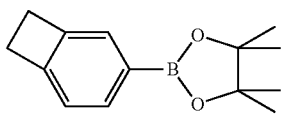

(described in page 58 of the specification of US Patent Application Laid-Open Publication No. 2017/0283546 A1).

(6) Synthesis of Polymer 1

Inside a reaction container was employed to be under the inert gas atmosphere, Compound MM11 (1.3 g, 1.43 mmol), Compound A (0.7 g, 1.45 mmol), Compound MM13 (70 mg, 0.152 mmol), Compound MM15 (80 mg, 0.151 mmol), dichlorobis(tris-o-methoxyphenylphosphine)palladium (1.3 mg) and toluene (42 ml) were added thereto, and the mixture was heated to 105° C.

In the reaction solution, a 20 mass % aqueous tetraethylammonium hydroxide solution (27 ml) was added thereto by dropping, and the mixture was refluxed for 8 hours.

After the reaction, Compound MM1 (138 mg, 0.60 mmol) and dichlorobis(tris-o-methoxyphenylphosphine)palladium (1.3 mg) were added to the reaction mixture, and the mixture was refluxed for 14 hours.

The reaction solution was cooled, and washed once with water, twice with a 10 mass % aqueous hydrochloric solution, twice with a 3 mass % aqueous ammonia solution and twice with water, and the obtained solution was added to methanol by dropping to observe precipitation.

The precipitates were dissolved in toluene, and the solution was purified by passing through an alumina column and a silica gel column in this order. The obtained solution was added to methanol by dropping, the mixture was stirred, and the produced precipitates were isolated by filtration and dried.

The yield of Polymer 1 was 1.4 g.

The calculated value of the average number of the repeating units was 10 per one polymer molecule obtained. In addition, the ratio of the repeating unit of Formula (1) (Compound A) included in the whole repeating unit of the polymer was 45.6 mol %. In addition, the ratio of the repeating units of Formulae (1) and (2) (Compounds A and MM11) included in the whole repeating unit of the polymer was 90.5 mol %.

(7) Synthesis of Polymer 2 Inside a reaction container was employed to be under the inert gas atmosphere, Compound B (1.1 g, 1.49 mmol), Compound MM14 (0.7 g, 1.28 mmol), Compound MM13 (70 mg, 0.152 mmol), Compound MM15 (80 mg, 0.151 mmol), dichlorobis(tris-o-methoxyphenylphosphine)palladium (1.3 mg) and toluene (42 ml) were added thereto, and the mixture was heated to 105° C.

In the reaction solution, a 20 mass % aqueous tetraethylammonium hydroxide solution (27 ml) was added thereto by dropping, and the mixture was refluxed for 8 hours.

After the reaction, Compound MM1 (138 mg, 0.60 mmol) and dichlorobis(tris-o-methoxyphenylphosphine)palladium (1.3 mg) were added to the reaction mixture, and the mixture was refluxed for 14 hours.

The reaction solution was cooled, and washed once with water, twice with a 10 mass % aqueous hydrochloric solution, twice with a 3 mass % aqueous ammonia solution and twice with water, and the obtained solution was added to methanol by dropping to observe precipitation.

The precipitates were dissolved in toluene, and the solution was purified by passing through an alumina column and a silica gel column in this order. The obtained solution was added to methanol by dropping, the mixture was stirred, and the produced precipitates were isolated by filtration and dried.

The yield of Polymer 2 was 1.5 g.

The calculated value of the average number of the repeating units was 34.7 per one polymer molecule obtained. In addition, the ratio of the repeating unit of Formula (1) (Compound B) included in the whole repeating unit of the polymer was 48.5 mol %. In addition, the ratio of the repeating units of Formulae (1) and (2) (Compounds B and MM14) included in the whole repeating unit of the polymer was 90.1 mol %.

(8) Synthesis of Polymer 3

Inside a reaction container was employed to be under the inert gas atmosphere, Compound MM11 (1.3 g, 1.43 mmol), Compound C (0.8 g, 1.27 mmol), Compound MM13 (70 mg, 0.152 mmol), Compound MM15 (80 mg, 0.151 mmol), dichlorobis(tris-o-methoxyphenylphosphine)palladium (1.3 mg) and toluene (42 ml) were added thereto, and the mixture was heated to 105° C.

In the reaction solution, a 20 mass % aqueous tetraethylammonium hydroxide solution (27 ml) was added thereto by dropping, and the mixture was refluxed for 8 hours.

After the reaction, Compound MM1 (138 mg, 0.60 mmol) and dichlorobis(tris-o-methoxyphenylphosphine)palladium (1.3 mg) were added to the reaction mixture, and the mixture was refluxed for 14 hours.

The reaction solution was cooled, and washed once with water, twice with a 10 mass % aqueous hydrochloric solution, twice with a 3 mass % aqueous ammonia solution and twice with water, and the obtained solution was added to methanol by dropping to observe precipitation.

The precipitates were dissolved in toluene, and the solution was purified by passing through an alumina column and a silica gel column in this order. The obtained solution was added to methanol by dropping, the mixture was stirred, and the produced precipitates were isolated by filtration and dried.

The yield of Polymer 3 was 1.4 g.

The calculated value of the average number of the repeating units was 21.6 per one polymer molecule obtained. In addition, the ratio of the repeating unit of Formula (1) (Compound C) included in the whole repeating unit of the polymer was 42.3 mol %. In addition, the ratio of the repeating units of Formulae (1) and (2) (Compounds C and MM11) included in the whole repeating unit of the polymer was 89.9 mol %.

(9) Synthesis of Polymer 4

Inside a reaction container was employed to be under the inert gas atmosphere, Compound D (1.2 g, 1.47 mmol), Compound MM14 (0.7 g, 1.28 mmol), Compound MM13 (70 mg, 0.152 mmol), Compound MM15 (80 mg, 0.151 mmol), dichlorobis(tris-o-methoxyphenylphosphine)palladium (1.3 mg) and toluene (42 ml) were added thereto, and the mixture was heated to 105° C.

In the reaction solution, a 20 mass % aqueous tetraethylammonium hydroxide solution (27 ml) was added thereto by dropping, and the mixture was refluxed for 8 hours.

After the reaction, Compound MM1 (138 mg, 0.60 mmol) and dichlorobis(tris-o-methoxyphenylphosphine)palladium (1.3 mg) were added to the reaction mixture, and the mixture was refluxed for 14 hours.

The reaction solution was cooled, and washed once with water, twice with a 10 mass % aqueous hydrochloric solution, twice with a 3 mass % aqueous ammonia solution and twice with water, and the obtained solution was added to methanol by dropping to observe precipitation.

The precipitates were dissolved in toluene, and the solution was purified by passing through an alumina column and a silica gel column in this order. The obtained solution was added to methanol by dropping, the mixture was stirred, and the produced precipitates were isolated by filtration and dried.

The yield of Polymer 4 was 1.3 g.

The calculated value of the average number of the repeating units was 28.6 per one polymer molecule obtained. In addition, the ratio of the repeating unit of Formula (1) (Compound D) included in the whole repeating unit of the polymer was 48.1 mol %. In addition, the ratio of the repeating units of Formulae (1) and (2) (Compounds D and MM14) included in the whole repeating unit of the polymer was 90.1 mol %.

(10) Synthesis of Polymer 5

Inside a reaction container was employed to be under the inert gas atmosphere, Compound B (1.1 g, 1.49 mmol), Compound A (0.7 g, 1.45 mmol), Compound MM13 (70 mg, 0.152 mmol), Compound MM15 (80 mg, 0.151 mmol), dichlorobis(tris-o-methoxyphenylphosphine)palladium (1.3 mg) and toluene (42 ml) were added thereto, and the mixture was heated to 105° C.

In the reaction solution, a 20 mass % aqueous tetraethylammonium hydroxide solution (27 ml) was added thereto by dropping, and the mixture was refluxed for 8 hours.

After the reaction, Compound MM1 (138 mg, 0.60 mmol) and dichlorobis(tris-o-methoxyphenylphosphine)palladium (1.3 mg) were added to the reaction mixture, and the mixture was refluxed for 14 hours.

The reaction solution was cooled, and washed once with water, twice with a 10 mass % aqueous hydrochloric solution, twice with a 3 mass % aqueous ammonia solution and twice with water, and the obtained solution was added to methanol by dropping to observe precipitation.

The precipitates were dissolved in toluene, and the solution was purified by passing through an alumina column and a silica gel column in this order. The obtained solution was added to methanol by dropping, the mixture was stirred, and the produced precipitates were isolated by filtration and dried.

The yield of Polymer 5 was 1.0 g.

The calculated value of the average number of the repeating units was 12.5 per one polymer molecule obtained. In addition, the ratio of the repeating unit of Formula (1) (Compound A and Compound B) included in the whole repeating unit of the polymer was 90.7 mol %. In addition, the ratio of the repeating units of Formulae (1) and (2) (Compounds A and B) included in the whole repeating unit of the polymer was 90.7 mol %.

(11) Synthesis of Reference Polymer (Polymer Ref)

Inside a reaction container was employed to be under the inert gas atmosphere, Compound MM11 (1.3 g, 1.43 mmol), Compound MM12 (1.1 g, 1.21 mmol), Compound MM13 (70 mg, 0.152 mmol), Compound MM15 (80 mg, 0.151 mmol), dichlorobis(tris-o-methoxyphenylphosphine)palladium (1.3 mg) and toluene (42 ml) were added thereto, and the mixture was heated to 105° C.

In the reaction solution, a 20 mass % aqueous tetraethylammonium hydroxide solution (27 ml) was added thereto by dropping, and the mixture was refluxed for 8 hours.

After the reaction, Compound MM1 (138 mg, 0.60 mmol) and dichlorobis(tris-o-methoxyphenylphosphine)palladium (1.3 mg) were added to the reaction mixture, and the mixture was refluxed for 14 hours.

The reaction solution was cooled, and washed once with water, twice with a 10 mass % aqueous hydrochloric solution, twice with a 3 mass % aqueous ammonia solution and twice with water, and the obtained solution was added to methanol by dropping to observe precipitation.

The precipitates were dissolved in toluene, and the solution was purified by passing through an alumina column and a silica gel column in this order. The obtained solution was added to methanol by dropping, the mixture was stirred, and the produced precipitates were isolated by filtration and dried.

The yield of the reference polymer (Polymer Ref) was 1.4 g.

The calculated value of the average number of the repeating units was 37.9 per one polymer molecule obtained. This reference polymer includes an aromatic amine structure in the polymer main chain, but does not have an aromatic amino group in the polymer side chain.

DEVICE EXAMPLE

Example 1

A composition for forming a hole injection layer was coated on a glass panel having an ITO anode formed thereon using a spin coating method to obtain a coating film having a film thickness of 60 nm. This coating film-formed substrate was heated for 10 minutes at 200° C. to insolubilize the coating film, and then allowed to naturally cool to room temperature to obtain a hole injection layer. The composition used for forming the hole injection layer was an aqueous PEDOT:PSS solution (poly(3,4-ethylenedioxythiophene): polystyrenesulfonic acid, product name:Baytron) purchased from Starck-V Tech.

Then, Polymer 1 and xylene were mixed so that Polymer 1 had a concentration of 0.7 mass %, and a composition for forming a hole transfer layer was obtained. The hole injection layer was coated with the composition for forming a hole transfer layer using a spin coating method to obtain a coating film having a thickness of 20 nm. The coating film-formed substrate was heated for 60 minutes at 180° C. to insolubilize the coating film, and then allowed to naturally cool to room temperature to obtain a hole transfer layer.

Next, 9,10-di(2-naphthyl)anthracene (ADN) as a light emitting host material, 1,6-bis(N,N-diphenylamino)pyrene (D1) as a dopant material, and xylene were mixed so that AND had a concentration of 1.3 mass % and D1 had a concentration of 0.05 mass %, and a composition for forming a light emitting layer was obtained. The hole transfer layer of the substrate formed including the anode, the hole injection layer and the hole transfer layer obtained above was coated with the composition for forming a light emitting layer described above using a spin coating method to obtain a coating film having a thickness of 60 nm. The coating film-formed substrate was heated for 20 minutes at 130° C. to evaporate the solvent, and then allowed to naturally cool to room temperature to obtain a light emitting layer.

After the above-described process, the each layer-formed glass substrate was introduced to a deposition apparatus for forming an electron transfer layer, and an electron transfer layer was deposited one by one under a vacuum degree of approximately $10^{-4}$ Pa to approximately $10^{-5}$ Pa. The electron transfer layer was formed to a layer thickness of approximately 25 nm using tris(8-hydroxyquinolinato)aluminum ($Alq_3$).

Then, the substrate was moved to a deposition apparatus for forming a metal layer, and an electron injection layer and a second electrode were deposited under a vacuum degree of approximately $10^{-4}$ Pa to approximately $10^{-5}$ Pa, and as a result, an organic EL device was manufactured. The electron injection layer was formed to a layer thickness of approximately 1 nm using lithium fluoride (LiF), and the second electrode was formed to a thickness of approximately 100 nm using aluminum (Al).

Using the above-described process, an organic EL device of Example 1 was manufactured.

Examples 2 to 5

Organic EL devices of Examples 2 to 5 were manufactured in substantially the same manner as in the process described in Example 1 except that the hole transfer layer was formed using any one of Polymers 2 to 5 instead of Polymer 1.

Comparative Example 1

An organic EL device of Comparative Example 1 was manufactured in substantially the same manner as in the process described in Example 1 except that the hole transfer layer was formed using the reference polymer instead of Polymer 1.

[Results of Device Evaluation]

Results of evaluating each of the organic EL devices manufactured in Examples 1 to 5 and Comparative Example 1 are shown in Table 1. Light emission properties of the manufactured organic EL device was evaluated at current density of 10 mA/cm² using a C9920-11 luminance light distribution property measuring device manufactured by Hamamatsu Photonics K.K. LT95 represents time taken for device luminance becoming a value of 95% of initial luminance, and as this value is higher, the device may be evaluated to have a longer lifetime.

TABLE 1

|  | Hole Transfer Layer | LT95 (Relative Value When Employing Comparative Example 1 as 1.0) |
|---|---|---|
| Example 1 | Polymer 1 | 1.9 |
| Example 2 | Polymer 2 | 1.8 |
| Example 3 | Polymer 3 | 1.7 |
| Example 4 | Polymer 4 | 1.7 |
| Example 5 | Polymer 5 | 1.4 |
| Comparative Example 1 | Reference Polymer | 1.0 |

When referring to the results shown in Table 1, it was seen that the lifetime of the organic EL devices manufactured in Examples 1 to 5 having a hole transfer layer formed using Polymers 1 to 5 according to embodiments described in the present specification was significantly enhanced compared to the lifetime of the device of Comparative Example 1.

INDUSTRIAL APPLICABILITY

The present disclosure may be used as a hole transfer material for an organic photoelectronic device, particularly, an organic EL device.

The invention claimed is:
1. A polymer comprising a repeating unit represented by Formula (1) in 40 mol % to 100 mol % of a total repeating unit forming the polymer:

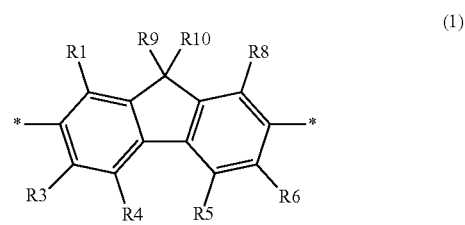

wherein, in Formula (1),
\* represents a bonding site with a neighboring repeating unit or an end group in the polymer;
R1, R3, R4, R5, R6 and R8 each independently represent a group selected from the group consisting of a hydrogen atom, a deuterium atom, a fluorine atom, a CN group, an NRaRb group, a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms, wherein Ra and Rb each independently represent a group selected from the group consisting of a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms;
at least one of R4 and R5 is an aromatic amino group represented by the following Formula (A) or (B),

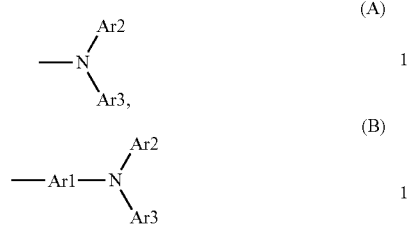

in Formulae (A) and (B),
Ar1 represents a substituted or unsubstituted arylene group having 6 to 30 ring-forming atoms, or a substituted or unsubstituted heteroarylene group having 5 to 30 ring-forming atoms;
Ar2 and Ar3 each independently represent a substituted or unsubstituted aryl group having 6 to 30 ring-forming atoms, or a substituted or unsubstituted heteroaryl group having 5 to 30 ring-forming atoms; and
R9 and R10 each independently represent a group selected from the group consisting of an alkyl group having 1 to 30 carbon atoms, an aryl group having 6 to 30 ring-forming atoms, and a heteroaryl group having 5 to 30 ring-forming atoms; or R9 and R10, together with the carbon atoms in Formula (1) to which they bond, form a cycloalkyl ring having 3 to 10 ring-forming atoms, or a spirofluorene ring, wherein the alkyl group, the aryl group, the heteroaryl group, the cycloalkyl ring, and the spirofluorene ring are each optionally substituted with an alkyl group having 1 to 30 carbon atoms, or an aryl group having 6 to 30 ring-forming atoms unsubstituted or substituted with an alkyl group having 1 to 30 carbon atoms.

2. The polymer of claim 1, further comprising, in addition to the repeating unit represented by Formula (1), at least one of a repeating unit represented by Formula (2), Formula (3) or Formula (4),
wherein a sum of the repeating unit represented by Formula (1) and a total repeating unit represented by Formula (2), Formula (3) orte Formula (4) is from 60 mol % to 100 mol % of the total repeating unit forming the polymer; and
the repeating unit represented by Formula (2) has a different chemical structure from the repeating unit represented by Formula (1):

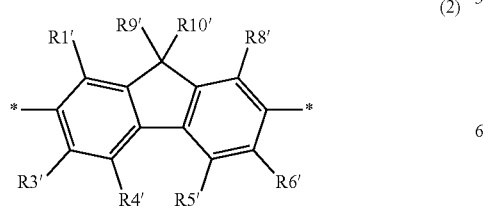

in Formula (2),
* represents a bonding site with a neighboring repeating unit or an end group in the polymer;

R1', R3', R4', R5', R6' and R8' each independently represent a group selected from the group consisting of a hydrogen atom, a deuterium atom, a fluorine atom, a CN group, an NRaRb group, a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms, wherein Ra and Rb each independently represent a group selected from the group consisting of a substituted or unsubstituted alkyl group having 1 to 30 carbon atoms, a substituted or unsubstituted aryl group having 6 to 30 ring-forming atoms, and a substituted or unsubstituted heteroaryl group having 5 to 30 ring-forming atoms; and R9' and R10' each independently represent a substituted or unsubstituted alkyl group having 1 to 30 carbon atoms, a substituted or unsubstituted aryl group having 6 to 30 ring-forming atoms, or a substituted or unsubstituted heteroaryl group having 5 to 30 ring-forming atoms; or R9' and R10', together with the carbon atoms in Formula (2) to which they bond, form a substituted or unsubstituted cycloalkyl ring having 3 to 10 ring-forming atoms, or a substituted or unsubstituted spirofluorene ring,

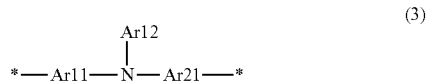

in Formula (3),
* represents a bonding site with a neighboring repeating unit or an end group in the polymer;
Ar12 represents a substituted or unsubstituted aryl group having 6 to 30 ring-forming atoms, or a substituted or unsubstituted heteroaryl group having 5 to 30 ring-forming atoms;
and Ar11 and Ar21 each independently represent a substituted or unsubstituted arylene group having 6 to 30 ring-forming atoms,

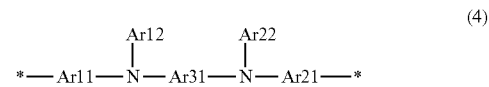

in Formula (4),
* represents a bonding site with a neighboring repeating unit or an end group in the polymer;
Ar12 and Ar22 each independently represent a substituted or unsubstituted aryl group having 6 to 30 ring-forming atoms, or a substituted or unsubstituted heteroaryl group having 5 to 30 ring-forming atoms; and
Ar11, Ar21 and Ar31 each independently represent a substituted or unsubstituted arylene group having 6 to 30 ring-forming atoms.

3. The polymer of claim 2, wherein the repeating unit represented by Formula (4) is a repeating unit represented by Formula (5), or the repeating unit represented by Formula (4) includes a repeating unit represented by Formula (5):

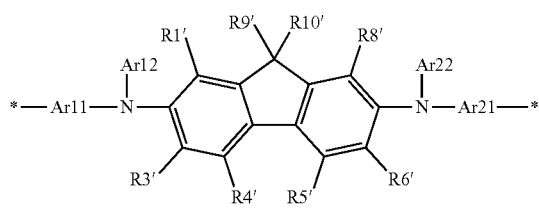

(5)

in Formula (5),

*, Ar11, Ar21, Ar12 and Ar22 each have the same meaning as defined in Formula (4); and R1', R3', R4', R5', R6', R8', R9' and R10' each have the same meaning as defined in Formula (2).

4. The polymer of claim 2, among the repeating unit represented by Formula (2), Formula (3) or Formula (4), only the repeating unit represented by Formula (2) is included, in addition to the repeating unit represented by Formula (1).

5. The polymer of claim 2, wherein the polymer is formed by alternately linking the repeating unit of Formula (1) and at least one of the repeating unit represented by Formula (2), Formula (3) or Formula (4), or the polymer includes a block in which the repeating unit of Formula (1) and at least one of the repeating unit represented by Formula (2), Formula (3) or Formula (4) are alternately linked.

6. The polymer of claim 4, wherein the polymer is formed by alternately linking the repeating unit of Formula (1) and the repeating unit represented by Formula (2), or the polymer includes a block in which the repeating unit of Formula (1) and the repeating unit represented by Formula (2) are alternately linked.

7. The polymer of claim 1, wherein, in Formula (1), R1, R3, R6, R8, R4 and R5 when not represented by Formula (A) or (B), are each independently a group selected from the group consisting of a hydrogen atom, a deuterium atom, an unsubstituted alkyl group having 1 to 30 carbon atoms, and an unsubstituted aryl group having 6 to 30 ring-forming atoms;

R9 and R10 are each an aryl group having 6 to 30 ring-forming atoms unsubstituted or substituted with an alkyl group having 1 to 30 carbon atoms; or R9 and R10, together with the carbon atoms in Formula (1) to which they bond, form a spirofluorene ring unsubstituted or substituted with an alkyl group having 1 to 30 carbon atoms;

Ar2 and Ar3 of Formulae (A) and (B) are each an aryl group having 6 to 30 ring-forming atoms unsubstituted or substituted with an alkyl group having 1 to 30 carbon atoms; and Ar1 of Formula (B) is an arylene group having 6 to 30 ring-forming atoms unsubstituted or substituted with an alkyl group having 1 to 30 carbon atoms.

8. The polymer of claim 2, wherein, in Formula (2), R1', R3', R4', R5', R6' and R8' each independently represent a group selected from the group consisting of a hydrogen atom, a deuterium atom, and an aryl group having 6 to 30 ring-forming atoms unsubstituted or substituted with an alkyl group having 1 to 30 carbon atoms; and R9' and R10' each independently represent an unsubstituted alkyl group having 1 to 30 carbon atoms, or an aryl group having 6 to 30 ring-forming atoms unsubstituted or substituted with an alkyl group having 1 to 30 carbon atoms; or R9' and R10', together with the carbon atoms of Formula (1) to which they bond, form a cycloalkyl group having 3 to 6 ring-forming atoms unsubstituted or substituted with an alkyl group having 1 to 30 carbon atoms, or a spirofluorene ring unsubstituted or substituted with an alkyl group having 1 to 30 carbon atoms.

9. The polymer of claim 1, comprising a repeating unit having a crosslinking group for crosslinking in the polymer, a crosslinking group for crosslinking at the end of the polymer, or a combination thereof.

10. The polymer of claim 9, wherein the crosslinking group is an alkenyl group, a group represented by the following formula, or a combination thereof:

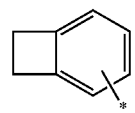

wherein * is an arbitrary position on the benzene ring, and represents a site bonding to the remaining part of the polymer.

11. The polymer of claim 1, wherein a number of the total repeating unit forming the polymer is an average of 10 to 1000 per one molecule.

12. A crosslinking polymer composition comprising:
the polymer of claim 9; and
a crosslinking agent capable of crosslinking the polymer by reacting with the crosslinking group that the polymer has.

13. A hole transfer material for an organic electronic device, the material comprising the polymer of claim 1.

14. A hole transfer material for an organic electronic device, the material comprising the crosslinking polymer composition of claim 12.

15. An organic electronic device comprising a cured material of the polymer of claim 1.

16. An organic electronic device comprising a crosslinked polymer obtained from the crosslinking polymer composition of claim 12.

17. A method for manufacturing an organic electronic device by forming one or more organic layers on a substrate, wherein at least one of the organic layers is formed using a process comprising:
preparing a polymer solution by dissolving the polymer of claim 1 in an organic solvent;
applying the polymer solution on a substrate; and
forming a polymer thin film by evaporating the organic solvent, and
optionally, when the polymer includes a crosslinking group, crosslinking the crosslinking group.

18. A method for manufacturing an organic electronic device by forming one or more organic layers on a substrate, wherein at least one of the organic layers is formed using a process comprising:
preparing a solution including the crosslinking polymer composition of claim 12 in an organic solvent;
applying the solution on a substrate;
forming a thin film including the polymer and the crosslinking agent by evaporating the organic solvent; and
reacting and crosslinking the polymer and the crosslinking agent.

* * * * *